(12) United States Patent
Halls et al.

(10) Patent No.: US 7,745,817 B2
(45) Date of Patent: Jun. 29, 2010

(54) COMBINED INFORMATION DISPLAY AND INFORMATION INPUT DEVICE

(75) Inventors: Jonathan Halls, Cambridge (GB); Matthew Shade, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 79 days.

(21) Appl. No.: 10/519,371

(22) PCT Filed: Jun. 26, 2003

(86) PCT No.: PCT/GB03/02734
§ 371 (c)(1), (2), (4) Date: Dec. 30, 2005

(87) PCT Pub. No.: WO2004/006350
PCT Pub. Date: Jan. 15, 2004

(65) Prior Publication Data
US 2006/0145365 A1    Jul. 6, 2006

(30) Foreign Application Priority Data
Jul. 3, 2002    (GB)    .................... 0215309.6

(51) Int. Cl.
H01L 35/24    (2006.01)
H01L 51/00    (2006.01)

(52) U.S. Cl. .......................... 257/40; 257/79
(58) Field of Classification Search ............ 257/40
See application file for complete search history.

(56) References Cited

U.S. PATENT DOCUMENTS

| | | | |
|---|---|---|---|
| 4,530,507 A | 7/1985 | Lee, Jr. | 279/1 Q |
| 5,294,869 A | 3/1994 | Tang et al. | 313/504 |
| 5,331,183 A | 7/1994 | Sariciftci et al. | 257/40 |
| 5,454,880 A | 10/1995 | Sariciftci et al. | 136/263 |
| 5,504,323 A | 4/1996 | Heeger et al. | 250/214.1 |
| 5,523,555 A | 6/1996 | Friend et al. | 250/214 R |
| 5,670,791 A | 9/1997 | Halls et al. | 257/40 |
| 5,739,545 A * | 4/1998 | Guha et al. | 257/40 |
| 5,929,845 A | 7/1999 | Wei et al. | 345/156 |

(Continued)

FOREIGN PATENT DOCUMENTS

EP    822 603 A2    2/1998

(Continued)

OTHER PUBLICATIONS

"Progress with Light-Emitting Polymers", Bernius et al., Adv. Mater. 12, No. 23, Dec. 1, 2000, pp. 1737-1750.
Search Report in GB 0215309.6 dated Feb. 26, 2003.
International Search Report in PCT/GB03/02734 dated Feb. 10, 2004.

*Primary Examiner*—Kenneth A Parker
*Assistant Examiner*—Anthony Ho
(74) *Attorney, Agent, or Firm*—Marshall, Gerstein & Borun LLP

(57) ABSTRACT

A combined information display and information input device comprising a matrix of independently addressable light emitting devices and a plurality of light sensing devices, the light emitting devices comprising organic light emitting diodes comprising organic light emitting material positioned between a low work function electrode and a high work function electrode characterized in that the light sensing devices comprise organic photovoltaic devices comprising at least an organic electron donor and at least an organic electron acceptor positioned between a high work function electrode and a low work function electrode. The combined information display and information input device has application as a touch screen, for example for a mobile communication device.

32 Claims, 9 Drawing Sheets

U.S. PATENT DOCUMENTS

| | | | |
|---|---|---|---|
| 6,080,031 A | 6/2000 | Rogers et al. | 445/25 |
| 2002/0079512 A1 | 6/2002 | Yamazaki et al. | 257/200 |
| 2002/0098377 A1* | 7/2002 | Cao et al. | 428/690 |
| 2002/0179898 A1* | 12/2002 | Marks et al. | 257/40 |

FOREIGN PATENT DOCUMENTS

| | | |
|---|---|---|
| EP | 822 603 A3 | 2/1998 |
| EP | 969 701 A1 | 1/2000 |
| EP | 1 058 314 A2 | 12/2000 |
| EP | 949 850 B1 | 8/2004 |
| GB | 2 315 594 A | 2/1998 |
| JP | 2000-58942 | 2/2000 |
| WO | WO 90/13148 | 11/1990 |
| WO | WO 97/42666 | 11/1997 |
| WO | WO 98/05187 | 2/1998 |
| WO | WO 99/49525 | 9/1999 |
| WO | WO 00/36661 | 6/2000 |

* cited by examiner

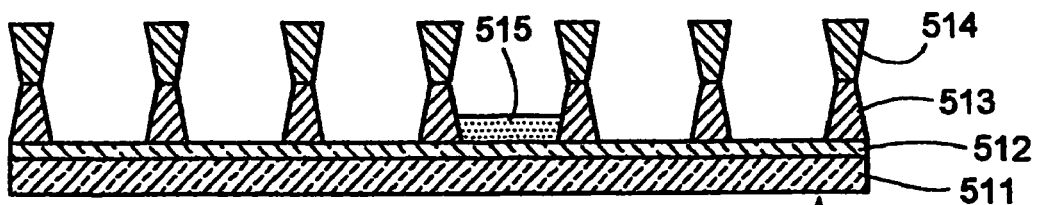
*Fig. 5b(i)*
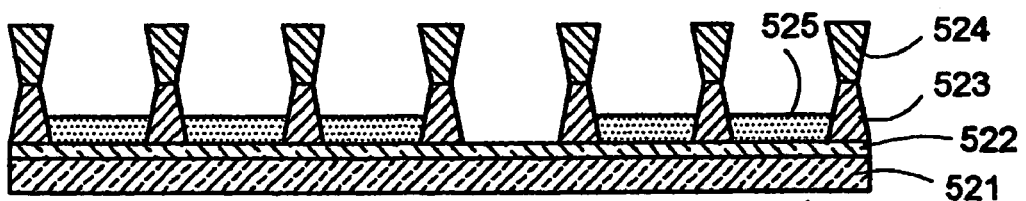
*Fig. 5b(ii)*
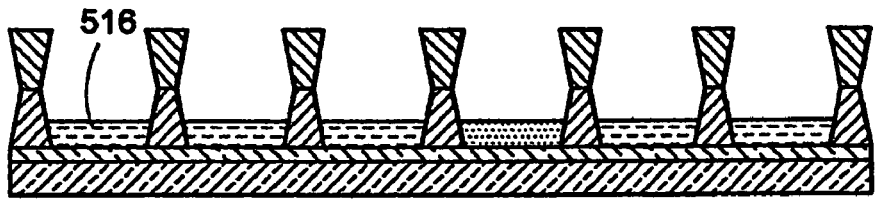
*Fig. 5c(i)*
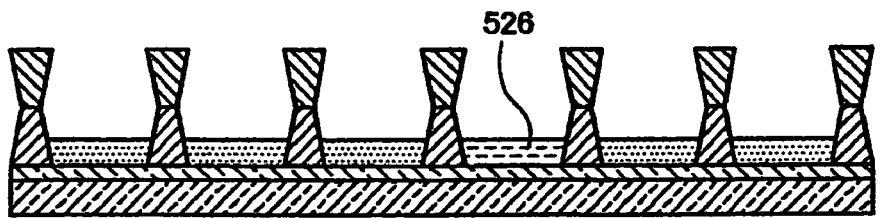
*Fig. 5c(ii)*
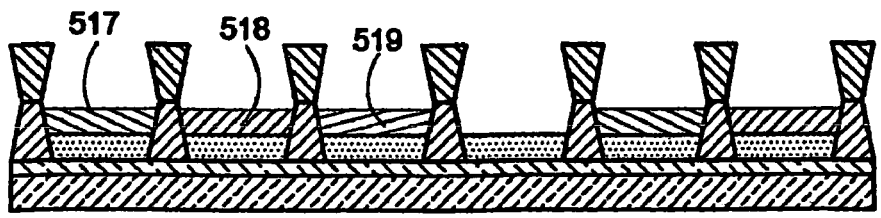
*Fig. 5d(i)*
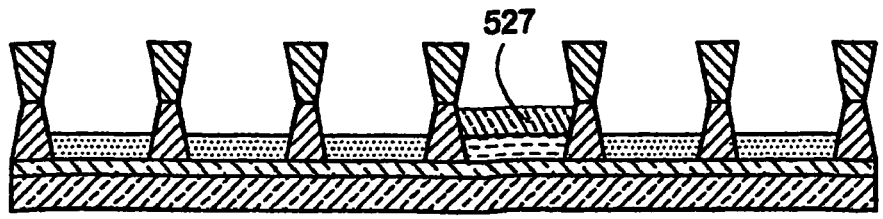
*Fig. 5d(ii)*

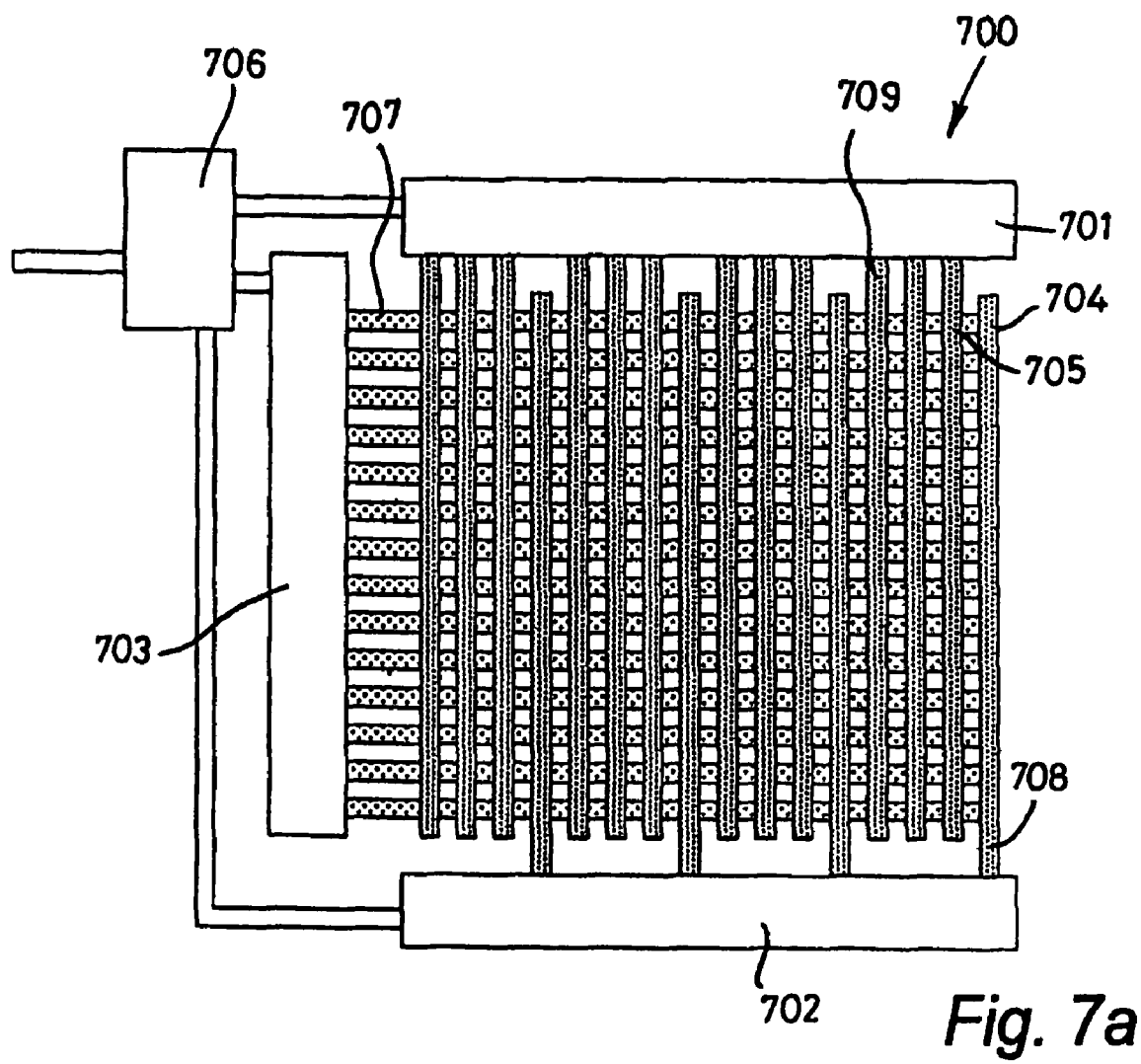
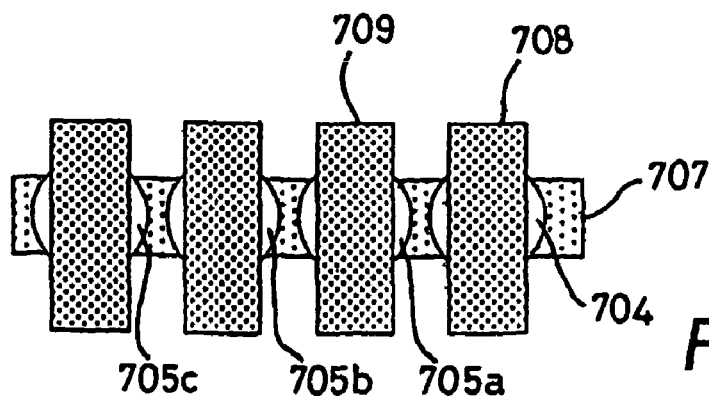

COMBINED INFORMATION DISPLAY AND INFORMATION INPUT DEVICE

This is the U.S. national phase of International Application No. PCT/GB03/02734 filed Jun. 26, 2003, the entire disclosure of which is incorporated herein by reference.

BACKGROUND OF THE INVENTION

1. Field of the Disclosure

The disclosures relates to a device, which enables both the display of information and the input of information. The device combines light emitting elements to provide an information display function and light sensing elements to provide an information-input function. In particular the disclosure relates to a combined information display and information input device based on organic materials wherein an organic light emitting material is used to provide the light emitting function and an organic light sensing material is used to provide the light sensing function. Methods of manufacture of such devices are also the subject of the disclosure.

2. Brief Description of the Prior Art

Apparatus capable of both displaying information and allowing the input of information are known with the most well established technologies operating by means of a touch sensitive panel or film applied over the surface of a standard display such as a backlit LCD or a CRT display. Such displays have the disadvantage that the introduction of a further component beyond those of the display itself adds to the complexity of manufacturing. In addition wear caused to the touch panel by regular contact limits the durability of this component and contact with the surface of the screen may cause distortion of the image displayed.

A number of efforts have been directed at integrating information display and information input functions onto a single substrate and thereby simplifying the manufacture of the displays. To date most of these efforts have been directed at the combination of LCD technology and inorganic semiconductor photosensor technology. The advantage of using photosensors rather than touch sensors is that no contact with the screen Is needed to input information.

The 1990s saw the growth of a display technology based on organic light emitting materials. Light emitting devices based on organic light emitting materials fall into two broad classes, those based on polymeric light emitting materials, as disclosed in WO 90/13148, and those devices based on low molecular weight light emitting materials, so called small molecules, such as disclosed in U.S. Pat. No. 4,530,507. At around the same time it was appreciated that the same semiconductive organic materials which provide the light emitting material in organic light emitting devices could also be used to detect light, see in particular the disclosure of the light sensing properties of light emitting polymers in U.S. Pat. Nos. 5,331,183 and 5,523,555.

It has been proposed to use this dual operating function of light emitting polymers to provide a device capable of both the display and the input of information. U.S. Pat. No. 5,929,845 discloses a scanner based on a matrix of organic light emitting devices with the devices emitting light onto the surface of the image to be scanned, light reflected from this image is detected by the display allowing information about the scanned image to be stored in a suitable information storage means and if desired displayed by means of the matrix of light emitting devices. This scanner device comprises a single matrix of light emitting polymer devices with each device functioning as both a light emitter and a light detector. U.S. Pat. No. 5,504,323 also suggests using a single matrix of organic light emitting devices with each device acting as both light emitter and light detector. GB2315594 discloses a scanning device where organic light emitting devices are used to provide a light source, light from which is reflected from the image to be scanned, this reflected light is detected by light emitting polymer based sensors.

In these prior art displays the organic electronic devices are used to provide both a light emitting function, when forward biased, and a light detecting function, when reverse biased. The disadvantage of such an arrangement is that the organic electronic devices cannot be optimised to perform both functions therefore any improvement in the light sensing property of the device will generally be detrimental to the light emitting property of the device and vice versa. Such devices can then not operate optimally as both right emitting devices and light sensing devices. Further the need to operate the organic electronic devices alternately in two modes requires complex electronic driving circuitry.

SUMMARY OF THE DISCLOSURE

The disclosure provides a combined information display and information input device which overcomes the problems of the prior art displays. The combined information display and information input device of the disclosure combines efficient light emitting devices and efficient light sensing devices providing a device which can be optimised for both the display of information and the input of information. The light emitting devices and light sensing devices of the disclosure can be optimised independently, this allows for the development of displays with better signal to noise ratios and displays which can, for example, display video images whilst still retaining a light sensing function.

Although the light emitting and light sensing devices can be optimised separately the similarity in the structures of the light emitting and light sensing devices of the disclosure allows the displays to be manufactured using a relatively limited number of steps. Taking the similarities in structure of the light emitting and light sensing devices into account the inventors disclosure provides an efficient and flexible method for the production of such devices. Further the disclosure provides a range of device architectures and driving schemes.

In a first embodiment the disclosure provides a combined information display and information input device comprising a matrix of independently addressable light emitting devices and a plurality of light sensing devices, the light emitting devices comprising organic light emitting diodes comprising organic light emitting material positioned between a low work function electrode and a high work function electrode characterised in that the light sensing devices comprise organic photovoltaic devices comprising at least an organic electron donor and at least an organic electron acceptor positioned between a high work function electrode and a low work function electrode.

The light sensing, organic photovoltaic devices preferably comprise a semiconductive organic polymer as either the electron donor or electron acceptor, in a more preferred embodiment both electron donor and electron acceptor are semiconductive organic polymers. The terms electron donor and electron acceptor are used in the art to describe the organic materials used in an organic photovoltaic device, with electron donor referring to materials having a low electron affinity and/or a low ionisation potential and electron acceptor referring to materials having a high electron affinity and/or a high ionisation potential.

Examples of suitable organic semiconductive polymers include polyfluorene, polybenzothiazole, polytriarylamine, poly(phenylenevinylene) and polythlophene. Polymers may be present as a layered structure or more preferably as a blend. In an alternative embodiment the light sensing organic photovoltaic device may comprise a fullerene, in particular devices comprising a blend of a fullerene and a semiconductive organic polymer are preferred. The organic photovoltaic device may comprise further additives such as molecular antenna which enhance light absorption by the device. Porphyrins and phthalocyanines are examples of molecular antenna.

The organic photovoltaic device comprises a high work function electrode, preferably having a work function of greater than 4.3 eV. The high work function electrode provides for the collection of holes (positive charge carriers) from the layer of organic photovoltaic material. Indium tin oxide is a preferred high work function electrode material. In order to increase the built in field formed across the photovoltaic material by the high and low work function electrodes it is preferred to provide a layer of hole transporting material between the high work function electrode and the organic photovoltaic material. The hole transporting material is preferably polystyrene sulfonic acid doped polyethylene dioxythiophene, known as PEDOT:PSS.

The organic photovoltaic device comprises a low work function electrode, preferably having a work function of less than 3.5 eV. The low work function electrode provides for the collection of electrons (negative charge carriers) into the layer of organic photovoltaic material. Preferred materials for forming the low work function electrode include Mg, Ca, Ba and Al. In order to increase the built in field formed across the photovoltaic material by the high and low work function electrodes it is preferred to provide a layer of insulating material positioned between said layer of organic photovoltaic material and said low work function electrode. The layer of insulating material should be sufficiently thin such that it allows charge collection into the low work function electrode from the layer of organic photovoltaic material, preferably the layer of insulating material has a thickness of between 1 and 10 nm. Preferred materials for the layer of insulating material include alkali or alkaline earth metal fluorides, such as UF or $BaF_2$.

The organic light emitting device comprises a high work function electrode, preferably having a work function of greater than 4.3 eV. The high work function electrode provides for the injection of holes (positive charge carriers) into the layer of organic light emitting material. Indium tin oxide is a preferred high work function electrode material. In order to further facilitate the injection of holes into the layer of organic light emitting material it is preferred to provide a layer of hole transporting material between the high work function electrode and the organic light emitting material. The hole transporting material is preferably polystyrene sulfonic add doped polyethylene dioxythlophene, known as PEDOT:PSS.

The organic light emitting device comprises a low work function electrode, preferably having a work function of less than 3.5 eV. The low work function electrode provides for the injection of electrons (negative charge carriers) into the layer of organic light emitting material. Preferred materials for forming the low work function electrode include Mg, Ca, Ba and Al. In order to further facilitate the injection of electrons into the layer of organic light emitting material it is preferred to provide a layer of insulating material positioned between said layer of organic light emitting material and said low work function electrode. The layer of insulating material should be sufficiently thin such that it allows charge injection from the low work function electrode into the layer of organic light emitting material, preferably the layer of insulating material has a thickness of between 1 nm and 90 nm. Preferred material for the layer of insulating material include alkali or alkaline earth metal fluorides, such as LiF or $BaF_2$.

The organic light emitting devices preferably comprises a semiconductive organic polymer as the light emitting material. The light emitting organic semiconductive polymer is preferably selected from the group comprising polyfluorene, polybenzothiazole, polytriarylamine, poly(phenylenevinylene) and polythlophene.

In a particularly advantageous embodiment the disclosure provides a combined information display and information input device wherein said organic photovoltaic devices are sensitive to light in a non-visible region of the electromagnetic spectrum. Preferably the light sensing devices are sensitive to light in the infrared region of the electromagnetic spectrum i.e. light having a wavelength greater than 700 nm.

The disclosure is also directed to multicolour information displays wherein the organic light emitting devices comprise a first group of organic light emitting devices and a second group of organic light emitting devices, the first group of organic light emitting devices emitting light of a first colour and the second group of said organic light emitting devices emitting light of a second colour. Preferably the device comprises a third group of light emitting devices emitting light of a third colour. The first second and third colors are most preferably selected from red, green and blue.

The disclosure is further directed to displays emitting light in a non-visible region of the electromagnetic spectrum wherein said organic light emitting devices comprise both a group of light emitting devices emitting light of a colour in the visible range of the electromagnetic spectrum and a group of light emitting devices emitting light in a non-visible region of the electromagnetic spectrum. Preferably light emitted in a non-visible region of the electromagnetic spectrum is emitted as light in the infrared region of the electromagnetic spectrum i.e. light of a wavelength greater than 700 nm.

The combined information display and information input device comprises a matrix of independently addressable light emitting devices. Preferably this matrix comprises a plurality of light emitting device addressing column electrodes and a plurality of light emitting device addressing row electrodes with the organic light emitting devices being positioned at the intersection of said column electrodes and said row electrodes. The row and column electrodes will preferably have an orthogonal arrangement relative to each other. The row and column electrodes may be formed by a strip of conducting material placed in electrical contact with the high work function electrode of the organic light emitting device and a strip of conducting material in electrical contact with the low work function electrode of the organic light emitting device. Alternatively the row and column electrodes may be formed by the high work function electrodes of the light emitting devices being formed as strips of high work function electrode material connecting neighboring light emitting devices and the low work function electrodes of the light emitting devices being formed as strips of low work function material connecting neighbouring light emitting devices. It is preferred that the row addressing electrodes are formed from or in contact with the high work function electrode of the light emitting devices and that the column addressing electrodes are formed from or are in contact with the low work function electrodes of the light emitting devices.

In a particularly preferred embodiment the plurality of light sensing devices comprises a matrix of independently addressable light sensing devices. Preferably this matrix comprises a plurality of light sensing device addressing column electrodes and a plurality of light sensing device addressing row electrodes with the organic photovoltaic devices being positioned at the intersection of said column electrodes and said row electrodes. The row and column electrodes will preferably have an orthogonal arrangement relative to each other. The row and column electrodes may be formed by a strip of conducting material placed in electrical contact with the high work function electrode of the organic photovoltaic device and a strip of conducting material in contact with the low work function electrode of the organic photovoltaic device. Alternatively the row and column electrodes may be formed by the high work function electrodes of the organic photovoltaic devices being formed as strips of high work function electrode material connecting neighbouring organic photovoltaic devices and the low work function electrodes of the organic photovoltaic devices being formed as strips of low work function material connecting neighbouring organic photovoltaic devices. It is preferred that the row addressing electrodes are formed from or in contact with the high work function electrode of the light emitting devices and that the column addressing electrodes are formed from or are in contact with the low work function electrodes of the light emitting devices.

The combined information display and information input device preferably further comprises a combined column driver and detector for addressing said light emitting device column electrodes and said light sensing device column electrodes. The column driver and detector comprising circuitry for providing a forward bias to said light emitting devices to cause them to emit light and comprising circuitry for detecting light incident on said light sensing devices. In an alternative embodiment separate column drivers are provided for addressing the column electrodes of the light emitting devices and the light sensing devices and in such an embodiment the device comprises a) a column driver for addressing said light emitting device column electrodes said column driver comprising circuitry for providing a forward bias to said light emitting devices to cause them to emit light and comprising b) a column detector for addressing said light sensing device column electrodes, said column detector comprising circuitry for detecting light incident on said light sensing devices. The column detector may further comprise circuitry for reverse biasing the photovoltaic devices.

The combined information display and information input device may further comprise a combined row selector driver for addressing said light emitting device row electrodes and said light sensing device row electrodes. In an alternative embodiment separate row selectors are provided for addressing the light emitting device row electrodes and the light sensing device row electrodes, in such an embodiment the device comprises a) a light emitting device row selector driver for addressing said light emitting devices row electrodes and b) a light sensing device row selector driver for addressing said light sensing device row electrodes.

Preferably in devices comprising a combined column driver and detector or a separate column detector, the column detector further comprises a means for reverse biasing the light sensing devices. Reverse biasing of organic photovoltaic devices has been shown to increase their sensitivity to incident light.

A suitable method for driving the combined displays of the disclosure involves applying a regular scanning signal to the row electrodes, addressing each row electrode in turn, while supplying a signal to the column electrodes of the light emitting devices from which light emission is required. In a similar manner a scanning signal may be applied to the row electrodes of the light sensing devices and the signal generated by incident light at a given light sensing device may be read at the column electrode. In such a method it is preferred to use a dock signal generating means for applying the scanning signal to the row electrodes. The role of the clock signal generating means is to provide a scanning signal to the combined row selector driver or to both the light emitting device row selector driver and the light sensing device row selector driver according to whether the light emitting and light sensing devices are addressed by a single set of row electrodes or by two separate sets of row electrodes.

It is preferred that the dock signal generating means provides scanning signals to the combined row selector driver or to said light emitting device row selector driver and said light sensing device row selector driver at a first higher frequency and a second lower frequency. The first higher frequency scanning signal addressing the light emitting device row electrodes and the second lower frequency scanning signal addressing the light sensing device row electrodes. In this manner the light emitting devices are addressed more frequently than the light sensing devices.

In a particular embodiment two clock signal generating means may be used to apply signals to the row electrodes, with a first clock signal generating means providing a scanning signal to the light emitting device row electrodes and a second dock signal generating means providing a scanning signal to the light sensing device row electrodes. It is preferred that the first clock signal generating means provides a higher frequency scanning signal than the second clock signal generating means.

The disclosure is also directed to a method for preparing a combined information display and information input device by means of selectively depositing the organic materials which constitute the light emitting and light sensing devices onto a patterned substrate. Accordingly the present invention is directed to a method of preparing a combined information display and information input device comprising;

a) providing a substrate, b) providing a patterned layer of conducting material having a high work function, c) providing a patterned layer of organic light emitting material and a patterned layer of organic photovoltaic material said organic photovoltaic material comprising at least an organic electron donor and at least an organic electron acceptor, d) providing a layer of a conducting material having a low work function.

The organic light emitting material and the organic photovoltaic material may be deposited either simultaneously or sequentially in either order.

It is preferred that said layer of conducting material of low work function is provided as a patterned layer of conductive material of low work function. A patterned layer of hole transporting material may also be provided over said layer of conductive material of high work function.

It is preferred that at least one of said steps of providing a patterned layer of organic light emitting material, providing a patterned layer of organic photovoltaic material or patterned layer of hole transporting material over said layer of conductive material of high work function comprises applying said material using a method of selective printing. Methods of selective printing include ink-jet printing, flexographic printing, gravure printing or screen printing. In particular inkjet printing is the preferred selective printing method.

A particularly preferred method of preparing a combined information display and information input device involves the steps of;

a) providing a substrate,
b) providing a patterned layer of conducting material having a high work function,
c) providing a first layer of insulating material over said layer of conducting material said first layer of insulating material being patterned to form a series of wells,
d) providing a second layer of insulating material said second layer of insulating material being patterned to form a series of parallel banks over said first layer of insulating material,
e) optionally depositing by means of ink-jet printing a layer of hole transporting material into a selection of said wells,
f) depositing by means of inkjet printing a layer of an organic light emitting material into a first selection of said wells,
g) depositing by means of ink-jet printing a layer of organic photovoltaic material comprising at least an organic electron donor and at least an organic electron acceptor into a second selection of said wells,
h) depositing a layer of a conducting material having a low work function over said layer of organic light emitting material and said layer of organic photovoltaic material, wherein steps f) and g) may be carried out in any order.

The disclosure also provides a method for preparing a combined information display and information input device where rows of light emitting devices and rows of light sensing devices are addressed by separate row electrodes. This method comprises;

a) providing a substrate,
b) providing a patterned layer of conducting material having a high work function,
c) providing a first layer of insulating material over said layer of conducting material said first layer of insulating material being patterned to form a series of wells,
d) providing a second layer of insulating material, said second layer of insulating material being patterned to form a series of parallel banks over said first layer of insulating material,
e) optionally depositing by means of inkjet printing a layer of hole transporting material into a selection of said wells,
f) depositing by means of inkjet printing a third layer of insulating material in a first selection of said wells,
g) depositing by means of ink-jet printing a layer of an organic light emitting material into a second selection of said wells,
h) depositing by means of ink-jet printing a layer of organic photovoltaic material comprising at least an organic electron donor and at least an organic electron acceptor into a third selection of said wells,
i) depositing a layer of a conducting material having a low work function over said layer of organic light emitting material and said layer of organic photovoltaic material, wherein steps e), f), g) or h) may be carried out in any order provided that when present the layer of hole transporting material is deposited prior to the deposition of the organic light emitting material or the organic photovoltaic material.

In the above mentioned methods the first and second layers of insulating materials are preferably photopatternable polymers. The third layer of insulating material is preferably a soluble insulating material suitable for deposition by selective printing techniques such as ink-jet printing.

The disclosure is further directed to the use of a combined information display and information input device according to the disclosure as a touch screen and further to the use of a combined information display and information input device according to the disclosure as an image scanner. The disclosure is further directed to a mobile communication device comprising a combined information display and information input device according to the disclosure.

DETAILED DESCRIPTION

BRIEF DESCRIPTION OF THE DRAWINGS

FIG. 7a) shows an implementation of a combined information display and information input device using a column driver, a separate column detector and a single row selector to address the light emitting and light sensing pixels.

FIG. 7b) shows a typical pixel layout for the implementation of FIG. 7a).

DESCRIPTION OF PREFERRED EMBODIMENTS

The combined information display and information input device of the disclosure has a matrix of light emitting devices, also known as pixels, which can be turned on or off to display an image. The display also has a set of light sensing devices, these are organic photovoltaic devices which are herein referred to as photodetector pixels. The photodetector pixels are distributed over the display and provide a means of detecting light intensity incident on the display surface. The light intensity distribution on the display's surface will be modulated by, for example, approaching a pointing device toward the screen. In this manner a user may input information into the display device. The pointing device may act to decrease light intensity at a point on the surface of the display by casting a shadow over certain of the photodetector pixels or may act to increase light intensity at a point on the surface of the display by reflecting light emitted from the display pixels back toward the photodetector pixels. The light intensity at each photodetector pixel may then be read to yield information on the spatial location of the pointing device on the display surface, the location will be detectable as either an increase or decrease in light intensity at a particular location on the display surface.

Figure 1A:
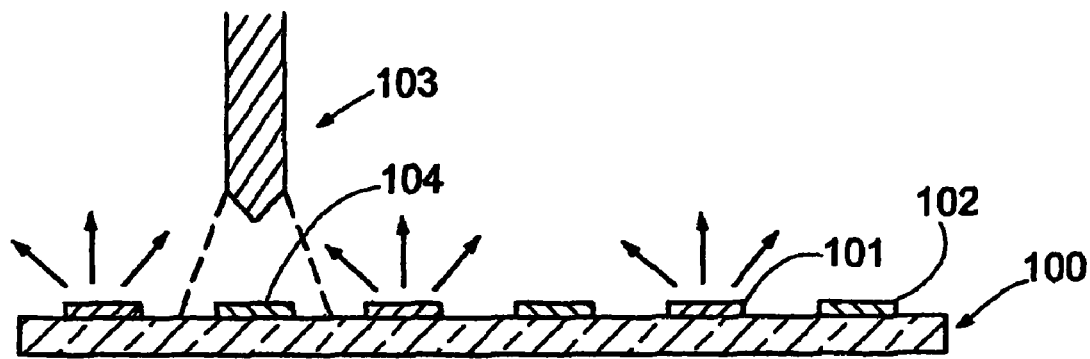
FIG. 1a) shows a first mode of operation of a combined information display and information input device.
Figure 1B:
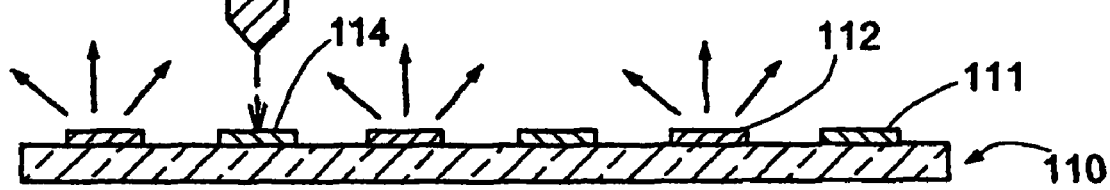
FIG. 1b) shows a second mode of operation of a combined information display and information input device.

FIG. 1a) shows schematically an array of light emitting pixels 101 and photodetector pixels 102 on a substrate 100. Pointing device 103 shields one or more of the photodetector pixels 104 from ambient light, this is measured as a decrease in light intensity at photodetector pixel 104 and allows the position of the pointer to be established. Alternatively, as shown in FIG. 1b) perturbations in light intensity may be determined by measuring the increase in light intensity at a particular location on the display surface. Here an array of light emitting pixels 112 and photodetector pixels 111 are arranged on a substrate 110. A pointing device 113 placed in proximity to the display surface reflects light emitted by the light emitting pixels back towards the display surface, this causes an increase in light intensity at the photodetector 114 in proximity to the pointing device. It is apparent that by using a distribution of photodetector pixels across the display, such as a x-y array of photodetector pixels, a map of light intensity over the surface of the display may be established, allowing the location of a pointer device to be established. Comparison of the distribution of light intensity over the display surface at different points in time will allow the movement of a pointer device across the surface of the display to be monitored. Perturbations in light intensity over the surface of the display may be used to provide input to the display device such as by allowing a user to point to an Icon on the display or to input text into the display by writing on the display surface.

Figure 2A:
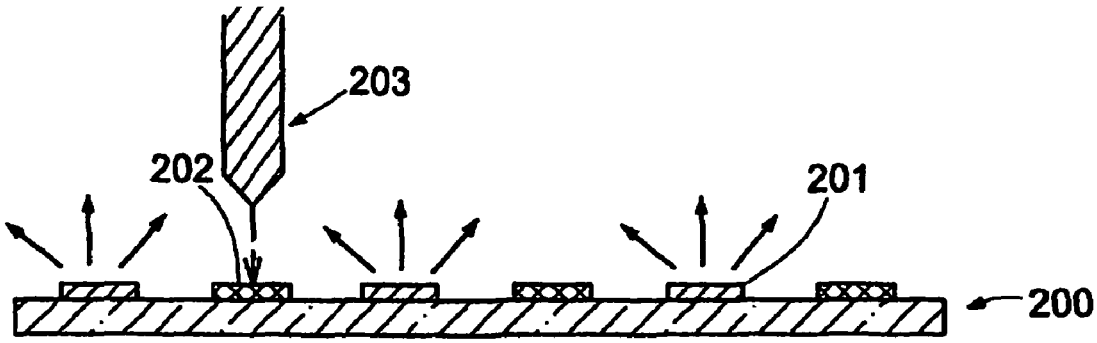
FIG. 2a) shows a mode of operation of a combined information display and information input device wherein an infrared light emitting pointing device is used to input information to the display.

In order to build up an image of the location of the perturbation of light intensity due to the pointer it will be necessary to deconvolve the perturbation in light intensity due to the pointer from fluctuations and inhomogeneity in the ambient light falling on the display's surface and variation in the light emitted by the display due to the display of a moving image. In order to simplify this procedure photodetector pixels may be tuned to detect light of a particular wavelength, in particular light of a non-visible wavelength such as infrared light having a wavelength of greater than 700 nm. Tuning of the photodetector pixels may be achieved by using a photodetector pixel comprising an organic material which is inherently more sensitive to light in the desired region of the electromagnetic spectrum or by using a filter to remove light of wavelengths other than those desired. Using a pointing device emitting light at the wavelength to which the photodetector pixel is tuned will then allow the signal detected at the photodetector pixels due to the pointer to be readily distinguished from perturbations due to ambient light and light emitted by the display pixels. FIG. 2a) shows the mode of operation of such a device, an array of light emitting pixels 201 and photodetector pixels 202 which are more sensitive to light in a non-visible region of the electromagnetic spectrum are arranged on a surface 200, a pointer device 203 which emits light in the region of the electromagnetic spectrum at which photodetector pixels 202 are sensitive is used to input information into the display.

Figure 2B:
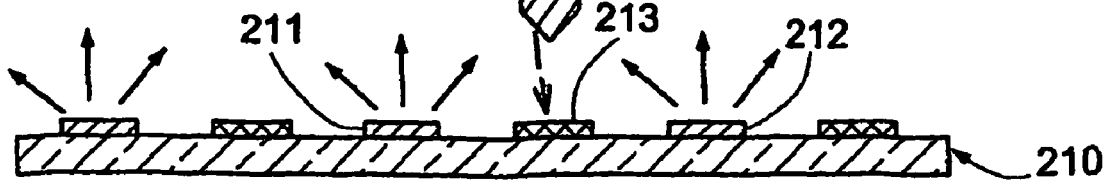
FIG. 2b) shows a mode of operation of a combined information display and information input device wherein light emitted by an infrared emitting pixel is reflected to an infrared detecting pixel by a pointing device.

An alternative to using a light emitting pointing device is to provide light emitting devices on the display surface which emit light in a non-visible region of the electromagnetic spectrum and using the pointer to reflect this light back to the photodetector pixels which are tuned to detect light at this wavelength. FIG. 2b) illustrates this mode of operation wherein an array of light emitting devices emitting light in the visible region of the electromagnetic spectrum 212, an array of light emitting devices emitting light in a non-visible region of the electromagnetic spectrum 211 and an array of photodetector pixels sensitive to light in a non-visible region of the electromagnetic spectrum 213 are arranged on a substrate 210. Pointer 214 causes light emitted from the display surface to be reflected back towards the display causing an increase in light intensity to be measured at the photodetector pixels. The photodetector pixels only detect light in the selected non-visible region of the electromagnetic spectrum so the functioning of the light detecting element of the display is not affected by fluctuations in incident light or changes in visible light emitted by the display due to the display of, for example, a moving image.

Another method to simplify the detection of the perturbation of light intensity due to the pointer is to use a lock in frequency amplifier whereby light at a particular frequency is emitted from the pointer or from the light emitting pixels of the display and the photodetector pixels are operated to act as phase sensitive detectors such that only light having this particular frequency is detected. Detection of light intensity by the photodetector pixels will not then be affected by changes in ambient light or changes in the image displayed on the display.

In order to build up an image of the perturbation of light intensity on the display surface due to the movement of a pointing device it is necessary that the photodetector pixels are distributed across the surface of the display. The photodetector pixels may be present in the form of a x-y matrix. Clearly the more photodetector pixels present on the display surface the greater the sensitivity of the input function of the display although the pitch of the photodetector pixels may not necessarily be as fine as the pitch of the light emitting pixels. To display a high-resolution image it is necessary that the light emitting pixels of the display occupy as much of the display surface as possible therefore it is preferable that the resolution of the photodetector pixels is lower than that of the light emitting pixels.

Figure 3:
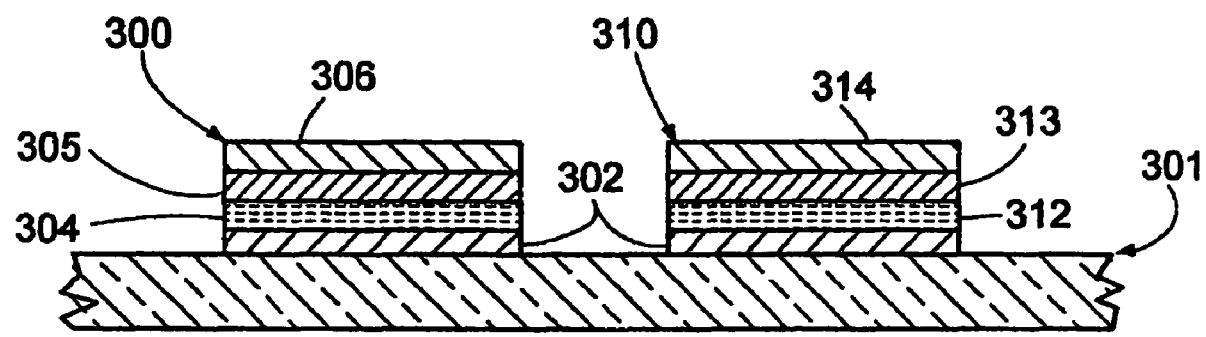
FIG. 3 shows in cross section a typical device structure of a combined information display and information input device.

FIG. 3 shows the typical structure of a light emitting pixel 300 and a photodetector pixel 310 according to the disclosure. For clarity FIG. 3 shows the two pixels to be of the same size and proximate to each other, clearly in a practical device the two types of pixel may be of different size and may be distributed such that, for example, the display has only a single photodetector pixel for every three or more light emitting pixels. The display comprises a substrate 301, suitable substrates include glass, ceramics and plastics such as acrylic resins, polycarbonate resins, polyester resins, polyethylene terephthalate resins and cyclic olefin resins. The substrate may be transparent, semi-transparent or, in cases where light is to be emitted and detected from the opposite side of the device, opaque. The substrate may be rigid or flexible and may comprise a composite material such as, for example, the glass and plastic composite disclosed in EP 0949850.

The substrate 301 is coated with a layer of conductive material of high work function 302 to form the anode of the eventual light-emitting and light detecting devices. Where it is desired that light be emitted through the substrate this conductive material should be transparent or semi-transparent and is selected from materials having a work function greater than 4.3 eV, such as indium-tin oxide (ITO), tin oxide, aluminum or indium doped zinc oxide, magnesium-indium oxide, cadmium tin-oxide, gold, sliver, nickel, palladium and platinum. ITO is the preferred high work function material. The high work function material is generally patterned to form an addressing element of the eventual matrix of light emitting devices. The pattern preferably is in the form of a series of parallel lines. These lines are typically of thickness of several hundreds of microns with gaps of several tens of microns between the parallel lines.

The light emitting pixel 300 comprises a layer of hole transporting material 304. Suitable hole transporting materials include polystyrene sulfonic acid doped polyethylene dioxythlophene (PEDOT:PSS), as disclosed in WO 9805187, polyaniline or TPD (N,N'-diphenyl-N,N'-bis(3-methylphenyl)[1,1'-biphenyl]-4,4'diamine). Over the layer of hole transporting material is a layer of light emitting material 305. The light emitting material may be a polymeric light emitting material, such as disclosed in Bernius et at Advanced Materials, 2000, 12, 1737 or a low molecular weight light emitting material such aluminum trisquinoline, as disclosed in U.S. Pat. No. 5,294,869. The light emitting material may comprise a blend of a light emitting material and a fluorescent dye or may comprise a layered structure of a light emitting material and a fluorescent dye. Light emitting polymers include polyfluorene, polybenzothlazole, polytriarylamine, poly(phenylenevinylene) and polythophene. Preferred light emitting polymers include homopolymers and copolymers of 9,9-di-n-octylfluorene (F8), N,N-bis(phenyl)-4-sec-butylphenylamine (TFB) and benzothiadiazole (BT). A layer of electron transporting or hole blocking material may be positioned over the layer of light emitting material if required to improve device efficiency.

A layer of material of low work function 306, which serves as a cathode, is positioned over the layer of light emitting material. Examples of suitable materials for the cathode include Li, Na, K, Rb, Be, Mg, Ca, Sr, Ba, Yb, Sm and Al. The cathode may comprise an alloy of such metals or an alloy of such metals in combination with other metals, for example the alloys MgAg and LiAl. The cathode preferably comprises multiple layers, for example Ca/Al or LiA/Al. The device may further comprise a layer of dielectric material between the cathode and the emitting layer, such as is disclosed in WO 97/42666. In particular it is preferred to use an alkali or alkaline earth metal fluoride as a dielectric layer between the cathode and the emitting material. Preferred cathode structures include LiF/Ca/Al and $BaF_2$/Ca/Al. In some cases it may be desired that the cathode be transparent, for example when an opaque substrate or anode is used or where it is desired that the whole device be transparent. Suitable transparent cathodes include a cathode comprising a thin layer of highly conductive material such as Ca and a thicker layer of transparent conducting material such as ITO, a preferred transparent cathode structure comprises $BaFa_2$/Ca/Au.

The mode of operation of the light emitting device is summarised as follows. A potential difference is provided between the anode 302 and the cathode 306, this results in the injection of charge carriers from the electrodes into the layer of light emitting material 305. Positive charge carriers or holes are injected from the anode and negative charge carriers are injected from the cathode. The two types of charge carrier combine in the layer of light emitting material to form an exciton which decays emitting a photon.

The light sensing device 310 is an organic photovoltaic device known as an organic heterojunction device, such devices are disclosed in U.S. Pat. No. 5,454,880. A typical organic heterojunction photovoltaic device comprises a layer of high work function material 302 on a substrate 301. Since the present display comprises a combination of light emitting devices and light detecting devices it is most practical to provide both types of devices on a single substrate and to address both types of devices using a single conductive material of high work function. Therefore the description of suitable materials for the substrate and high work function material of the light emitting device also apply to those of the light detecting device.

The photovoltaic device 310 comprises a layer of hole transporting material 312. Suitable hole transporting materials include polystyrene sulfonic acid doped polyethylene dioxythiophene (PEDOT:PSS), as disclosed in WO98/05187, polyaniline or TPD (N,N'-diphenyl-N,N'-bis(3-methylphenyl)[1,1'-biphenyl]4,4'-diamine). Over the layer of hole transporting material is provided a layer of organic photovoltaic material 313. The organic photovoltaic material comprises an electron donor and an electron acceptor.

A variety of structures of the organic photovoltaic devices are possible. The electron donor and electron acceptor may comprise polymers or low molecular weight compounds. The electron donor and acceptor may be present as two separate layers, as disclosed in WO 99/49525, or as a blend, as disclosed in U.S. Pat. No. 5,670,791, a so called bulk heterojunction. The electron donor and acceptor may be selected from perylene derivatives such as N,N'-diphenylglyoxaline-3,4,9,10-perylene tetracarboxylic acid diacidamide, fullerenes ($C_{60}$), fullerene derivatives and fullerene containing polymers and semiconducting organic polymers such as polyfuorenes, polybenzothiazoles, polytriarylamines, poly (phenylenevinylenes), polyphenylenes, polythiophenes, polypyrroles, polyacetylenes, polylsonaphthalenes and polyquinolines. Preferred polymers include MEH-PPV (poly (2-methoxy, 5-(2'-ethyl)hexyloxy-p-phenylenevinylene)), MEH-CN-PPV (poly 2,5-bis(nitrilemethyl)-1-methoxy-4-(2'-ethyl-hexyloxy)benzene-co-2,5-dialdehyde-1-methoxy4-(2'-ethylhexyloxy)benzene)) and CN-PPV cyano substituted PPV, polyalkylthiophenes, such as poly(3-hexylthiophene), POPT poly(3(4-octylphenyl)thiophene) and poly(3-dodecyithlophene), polyfluorenes, such as poly(2,7-(9,9-dinotylfluorene), poly(2,7-(9,9-di-n-octylfluorene)-benzothiadiazole) and poly(2,7-(9,9-di-n-octylfluorene)-(4,7-di-2-thienyl-(benzothiazole)). Typical device structures include a blend of N,N'-diphenylglyoxaline-3,4,9,10-perylene tetracarboxylic add diacidamide and poly(3-dodecylthiophene), a layered structure comprising a layer of MEH-PPV and a layer of $C_{60}$, a blend of MEH-PPV and $C_{60}$, a layered structure comprising a layer of MEH-CN-PPV and a layer of POPT, a blend comprising MEH-PPV and CN-PPV and a blend comprising poly(3-hexylthiophene) and poly(2,7-(9,9-di-n-octylfluorene)-(4,7-di-2-thienyl-(benzothiazole)). A cathode 314 of material of low work function is provided over the layer of organic photovoltaic material. Materials suitable for the cathode of the light emitting device are also suitable for the cathode of the photovoltaic device.

Organic heterojunction photovoltaic devices operate in the manner described as follows. The electrodes of different work function set up an internal electric field across the device. Absorption of light by the materials of the organic layer generates bound electron-hole pairs, termed exitons. Excitons generated on the material of lower electron affinity dissociate by transfer of an electron to the material of higher electron affinity, the material of lower electron affinity is sometimes referred to as the electron donor or simply donor. Excitons generated on the material of higher electron affinity dissociate by transfer of a hole to the material of lower electron affinity, the material of higher electron affinity is sometimes referred to as the electron acceptor or simply acceptor. The electrons and holes generated by dissociation of the exictons then move through the device, with electrons moving to the lower work function cathode and holes moving to the higher work function anode. In this way light incident on the device generates a current which may be used in an external circuit. In the devices of the disclosure the current generated at the photovoltaic device is measured using suitable circuitry and this provides a measurement of the light intensity incident on the photovoltaic device. In this way the photovoltaic device can be considered to operate as a photodetector, detecting light incident on the device. Applying an additional potential difference between the electrodes of the organic photodetector increases its sensitivity by increasing charge carrier mobility, improving charge transport and reducing charge carrier recombination.

The display device comprising the organic light emitting devices and organic photodetector devices may also be provided with an encapsulant which acts to seal the device from the atmosphere. Suitable methods of encapsulation include covering the device on the cathode side with a metal can or glass sheet or providing an impermeable film over the device, such as a film comprising a stack of polymer layers and inorganic layers.

The performance of the device may be enhanced by adding optical elements to improve light extraction from the light emitting pixels and to improve light input into the photodetector pixels. Methods of enhancing light extraction include the provision of microcavities and materials of low dielectric constant over the surface of the light emitting pixel through which light is emitting. Methods of improving light input into the photodetector pixels include the provision of antireflection films, microlenses or a corrugated surface over the surface of the photodetector pixel.

The substrate and the patterned layer of high work function material may be prepared using techniques known in the art, for example sputter deposition of ITO followed by photolithographic patterning. The hole transporting material may be deposited by a number of techniques known in the art and may be patterned or unpatterned. Typical methods of deposition of the hole transport material include vapour deposition, dose spaced deposition, laser induced thermal transfer, spin coating, doctor blade coating or selective printing. Selective printing methods are preferred as they do not require complex and expensive equipment, such as vacuum chambers, and give a high degree of control over the resolution of the pattern obtained. Selective printing techniques include screen printing, flexographic printing, gravure printing and ink-jet printing. Of these techniques ink-jet printing is preferred as this technique offers a high degree of resolution and a greater control over the location of the pixels and the thickness of the device layers of the pixels.

The light emitting material and the electron donor and electron acceptor which comprise the photovoltaic material may be deposited by a suitable patterning technique. Both soluble and insoluble organic materials may be deposited by techniques such as vapour deposition, close spaced deposition and laser induced thermal transfer. Soluble organic materials, such as light emitting polymers, may be deposited by selective printing methods such as screen printing, flexographic printing, gravure printing and inklet printing. These techniques may be used to build multiple layers of organic materials. As discussed above inkjet printing is the preferred method of patterning.

The low work function material which forms the upper electrode or cathode of the devices is generally deposited by vapour deposition, although a suitable material may be printed. In most cases the cathode will be patterned, this is achieved by vapour depositing the cathode material through a shadow mask, a particularly advantageous technique involves depositing the cathode through an integral shadow mask as explained below.

The similarity in device structure of the organic light emitting device and the organic photodetector is an advantage of the combined information display and information input device of the disclosure. The two devices share a number of features such as the nature of the electrodes and the use of a hole transporting layer. These similarities allow the devices to be prepared in a very efficient manner with a limited number of steps and with the same manufacturing steps being carried out to form both the light emitting devices and the photodetectors. In the combined information display and information input devices of the prior art, such as a combination of LCDs and semiconductor photodetectors, the display function and the light detection function are provided by devices which are substantially different in structure and so the production of these devices requires a greater number of steps.

A significant advantage of the device of the disclosure is that the preferred organic materials which constitute the device, in particular conducting and semiconducting polymers, are soluble and can be deposited using solution deposition techniques and in particular printing techniques. Printing techniques do not require expensive and complex equipment, are potentially environmentally benign and may be applied to a great range of substrates such as flexible substrates. The following gives a detailed description of the use of ink jet printing to prepare devices according to the disclosure comprising light emitting and light detecting materials based on polymers. Clearly other selective printing methods such as flexographic printing could also be used.

FIG. 4 illustrates a preferred method of preparing a combined information display and information input device 400 according to the disclosure. FIG. 4(a) shows a cross sectional view of a glass substrate 401 suitable for a device of the disclosure. The substrate is coated with a layer of ITO 402 to form the anode of the eventual organic electronic devices. ITO may be deposited by sputtering or any other suitable method known to those in the art The ITO layer on the substrate is then patterned using photolithography, wherein the layer of ITO is coated with a photoresist, patterned, for example using a UV source and a photomask, and developed using the appropriate developing solution, exposed ITO is then removed by chemical etching, leaving a patterned layer of ITO. Typically the ITO is patterned to form a series of parallel stripes.

Figure 4A:
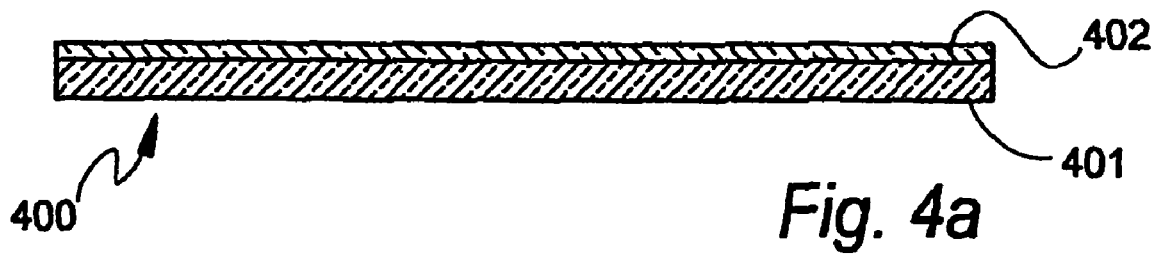
FIG. 4a) to g) shows a method of manufacture of an information display and information input device where light emitting pixels and light sensing pixels are addressed by the same row electrodes.
Figure 4B:
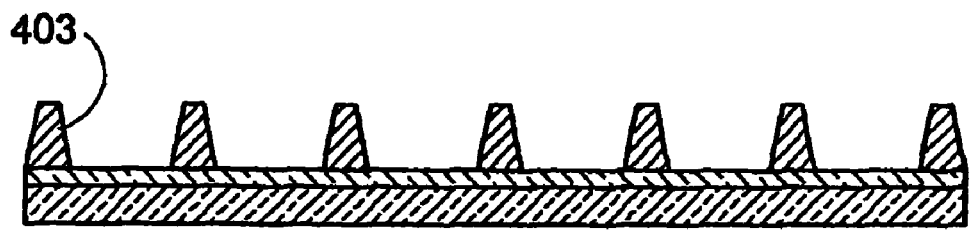

A layer of photopatternable, insulating polymer such as a polyimide or a fluorinated photoresist 403 is then deposited onto the patterned ITO as shown in FIG. 4(b). The photopatternable polymer may be deposited by spin-coating, doctor blade coating or any other suitable technique. The photopatternable polymer is patterned using conventional photolithographic techniques, for example after deposition the photopatternable polymer is dried, exposed to UV light through a mask, soft baked, developed using, for example, tetramethylammonium hydroxide, rinsed and hard baked. Preferred patterns of the insulating polymer are those that define banks, which are one dimensional patterns, for example parallel stripes, or wells, which are two dimensional patterns of recesses in the insulating polymer. Banks typically have a height of 0.5 to 10 microns and a width of 10 to 100 microns and define channels containing regions of ITO having a width of 10 to 500 microns. Wells may have a diameter of 10 to 100 microns. FIG. 4b) shows a substrate 401 with a patterned layer of ITO 402 and a layer of photopatternable polymer 403 which has been patterned to form a series of wells. One of the functions of the wells is to define the pixel areas of the eventual light emitting and light detecting devices.

Figure 4C:
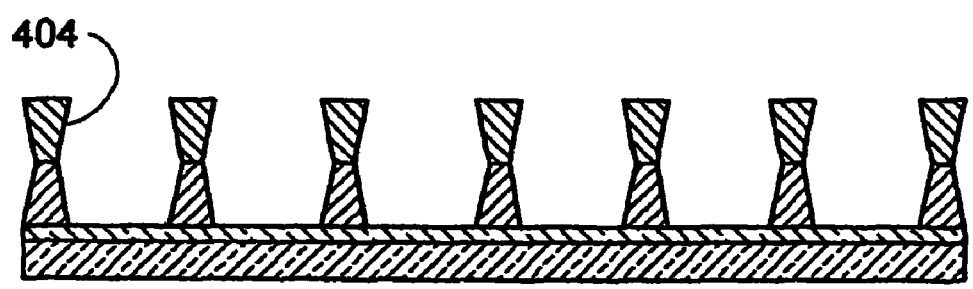

The substrate is then provided with a further layer of photopatternable polymer 404 as shown in FIG. 4c). This layer of photopatternable polymer is patterned to form a series of parallel banks running in a direction orthogonal to the patterned lines of ITO. The second layer of photopatternable polymer is patterned using similar methods to the first. It is advantageous if the photopatternable polymer 404 is etched so as to leave banks having an negative wall profile as illustrated in FIG. 4(*c*). Banks 404 having a negative wall profile are narrower in proximity to the substrate, typically a bank will have an upper width of around 40 microns and a lower width of around 20 to 38 microns. Techniques for obtaining banks with a negative wall profile are known in the art and, in the case of a negative photoresist, involve underexposing and then overdeveloping the photoresist. The provision of banks with a negative wail profile is beneficial for the further processing of the substrate, in particular banks having a negative wall profile aid the patterned deposition of the metallic cathode. EP0969701 discloses the use of banks having a negative wall profile in the deposition of a cathode in an organic electroluminescent device. Where the first layer of photopatternable polymer 403, comprises a pattern of wells these generally have a positive wall profile, this enables any deposited solution to flow more easily into the well. Techniques for obtaining wells with a positive wall profile are known in the art and typically, in the case of a negative photoresist, involve overexposing and then underdeveloping the photoresist The substrate, layers of photopatternable polymer and exposed ITO may be further surface treated for example using oxygen plasma or ultraviolet light. This serves to alter the surface energies of the materials of the substrate making them more suitable for the deposition of the device layers. Surface treatment is particularly desirable when further materials are to be deposited by solution processing techniques.

Figure 4D:
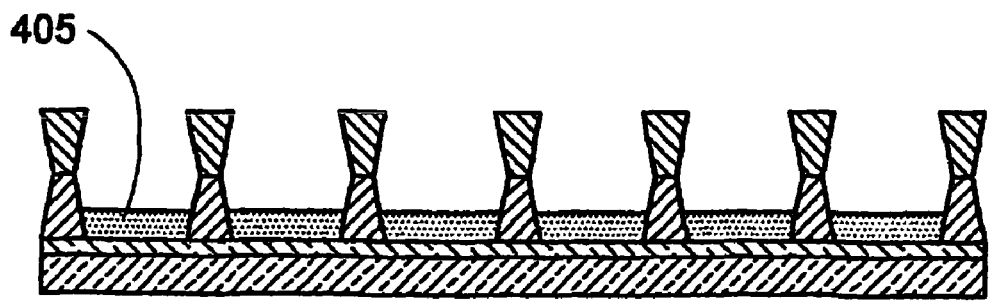

A layer of hole-transporting material, FIG. 4*d*) 405, is then deposited upon the patterned ITO. The preferred hole-transport material used in the art is a conductive organic polymer such as polystyrene sulfonic acid doped polyethylene dioxythlophene (PEDOT:PSS) as disclosed in WO98/05187, although other hole transporting materials such as doped polyaniline may also be used. The hole-transporting material may be deposited by spin coating. The hole transporting material is preferably deposited by ink jet printing. PEDOT:PSS may be inkjet printed as an aqueous solution.

Figure 4E:
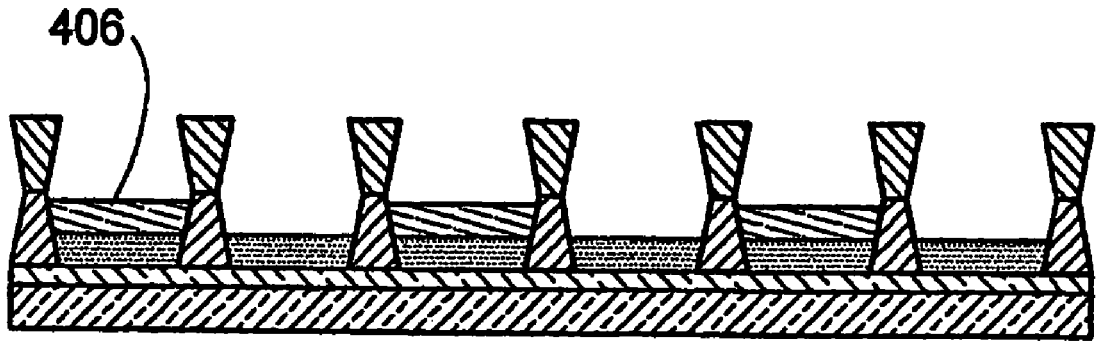

Following deposition of the hole transporting layer, a layer of light emitting material, FIG. 4*e*) 406 is deposited into selected wells on the substrate. To form a monochrome display with a ratio of 1:1 between the number of light emitting pixel to the number of photodetector pixels the light emitting material is deposited in alternate wells. To form an RGB display with a ratio of 3:1 between the number of light emitting pixels and the number of photodetector pixels light emitting material is deposited in three out of every four wells with red, green and blue light emitting materials being deposited as appropriate. A wide range of other distributions are possible, for example a 9:1 ratio of light emitting to photodetecting pixels. Alternatively a material emitting light in a non-visible region of the electromagnetic spectrum may be deposited in addition to the material of the light emitting pixels. Light emitting polymer is deposited using ink-jet printing. Conjugated polymers such as polyfluorene and poly(phenylene vinylene) may be ink-Jet printed from solutions of aromatic solvents such as toluene, xylene, trimethylbenzene etc.

Figure 4F:
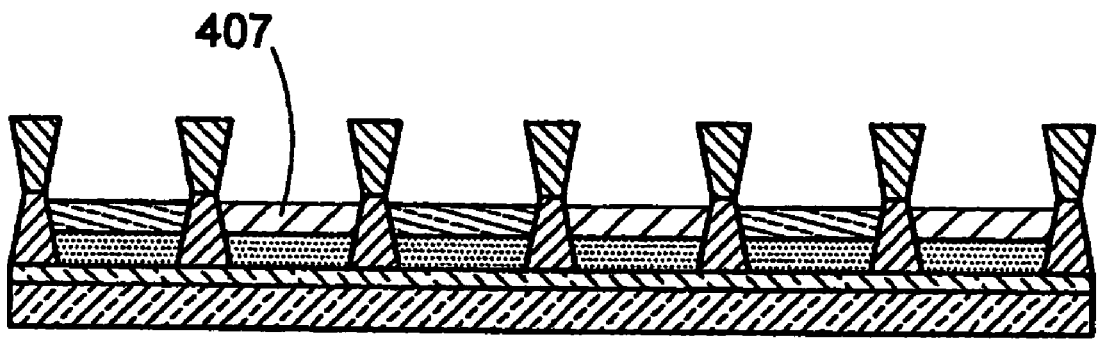
Figure 4G:
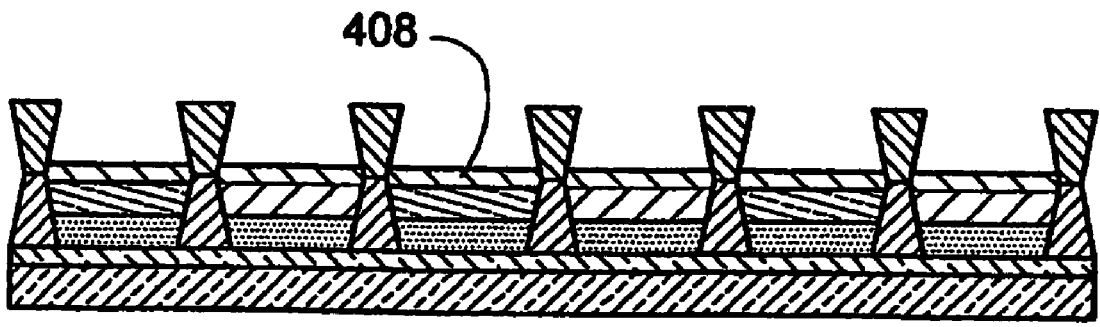

Following deposition of the light emitting material on selected pixels the organic photovoltaic material is deposited in all, or a selection of, the remaining pixels, FIG. 4*f*) 407. Ink-jet printing is the preferred method for the deposition of the photovoltaic material. The organic photovoltaic material may be deposited as a blend or may be deposited in two steps to form a layered structure. Where the organic photovoltaic material comprises a conjugated polymer this may be ink-jet printed using an aromatic solvent such as toluene, xylene, mesitylene or trimethylbenzene.

The printing strategy used to deposit the organic light emitting material and the organic photovoltaic material may be varied. For example the organic light emitting material may be deposited in a first pass of the ink-jet printing head or heads and the organic photovoltaic material may be deposited in a second pass of the inkjet printing head or heads, or vice-versa. Alternatively the organic light emitting material and the organic photovoltaic material may be deposited during the same pass of the inklet printing heads or heads.

A cathode material 408 is then deposited over the light emitting material and the light detecting material. The cathode material is deposited by means of vapour deposition. Where appropriate multilayer cathodes may be deposited, for example the cathodes comprising a layer of alkali or alkaline earth metal fluorides and layers of metals as discussed above. A particularly preferred cathode comprises LiF/Ca/Al, with a layer of LiF of thickness from 1 nm to 10 nm, a layer of Ca of thickness of 1 nm to 25 nm and a layer of Al of thickness 10 nm to 500 nm. It is a notable advantage of the disclosure that a single cathode may be deposited over both the light emitting devices and the photovoltaic devices without the need for carrying out multistep metal deposition processes.

The device is then encapsulated, this may be carried out by means of enclosing the device in a metal can or glass cover to protect the device from the environment, an oxygen or moisture absorbent may be including within the metal can or glass cover, such a technique is disclosed in U.S. Pat. No. 6,080, 031. Alternatively devices may be encapsulated by laminating an impermeable composite material over the device as is disclosed in WO 00/36661. Given the similarity in structure of the light emitting devices and photovoltaic devices of the disclosure the same encapsulation system may be used to protect both types of device devices from the environment since the different devices are likely to be susceptible to similar environmental degradation mechanisms.

In a particularly preferred embodiment the combined information display and information input device is prepared such that the light emitting devices and the photodetectors are on separate rows of the display. This is in contrast to the device shown in FIG. 4 where light emitting devices and photodetectors are provided on the same row of the display. The advantages of this arrangement will become apparent later in the description and relate to the benefits of electrically insulating neighbouring light emitting and photodetector pixels.

Figure 5A:
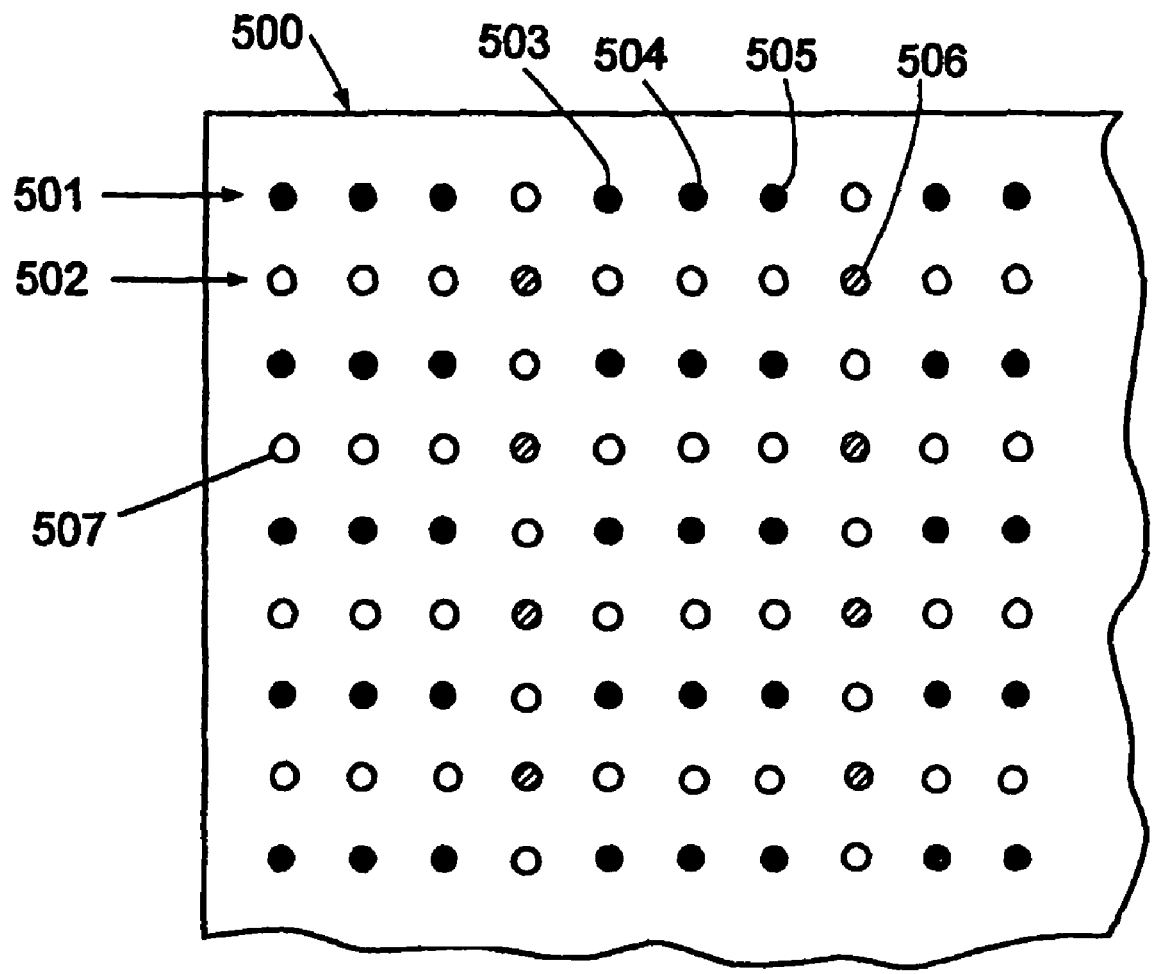
FIG. 5a) to d) shows a method of manufacture of an information display and information input device where light emitting pixels and light sensing pixels are addressed by the different row electrodes.

FIG. 5*a*) shows schematically a section of a combined information display and information input device 500. The display comprises a matrix of light emitting pixels of different colours, namely red 503, green 504, and blue 505, and photodetectors 506 arranged in rows and columns. The light emitting pixels and photodetector pixels are positioned on separate rows and columns with for example light emitting devices situation on row 501 and photodetectors on row 502. Pixels on the row of light emitting devices which correspond to the position of the photodetector pixels on the row of light sensing devices are filled with an insulating material 507. Likewise pixels on the row of light sensing devices which correspond to the position of the light emitting pixels on the row of light emitting devices are filled with an insulating material. The insulating material serves to prevent contact between the cathodes and anodes which run along the rows and columns and thereby prevent any electrical shorting at what would otherwise be vacant pixels. Clearly other arrangements of light emitting devices and photodetectors are possible, for example whereby one row of photodetector pixels is present for every nine rows of light emitting pixels.

Displays corresponding to FIG. 5a) are prepared in the following manner. FIGS. 5b) to 6d) show the preparation of a row of light emitting pixels 510 e.g. FIG. 5b) i) and the preparation of a row of photodetector pixels 520 e.g. FIG. 5b) ii). The display substrate is prepared as outlined above to provide a substrate 511, 521, a patterned layer of high work function conductive material such as ITO 512, 522, a layer of photopatternable insulating material patterned to form a matrix of wells 513, 523 and a layer of photopatternable insulating material patterned to form a series of parallel banks 514, 524. Pixels in the row of light emitting devices FIG. 5b) i) which correspond to photodetector pixels in the row of photodetectors are filled with an insulating material 515, likewise pixels in the row of photodetectors FIG. 5b) ii) which correspond to light emitting pixels in the row of light emitting devices are filled with an insulating material 525. The insulating material may be any suitable insulating material and is preferably polymethylmethacrylate, polyvinylphenol or polystyrene. The insulating material may be deposited by any suitable method, but it is preferred that the insulating material is deposited by a selective printing process and most preferably by means of ink jet printing. For this reason it is preferred to use insulating materials such as polystyrene which are soluble in aromatic solvents such as toluene and xylene.

Following the deposition of the insulating material 515, 525 the light emitting and photodetector devices may be prepared in the manner described above. A layer of hole transporting material such as PEDOT:PSS is provided over the exposed regions of high work function material, FIG. 5c) i) and ii) 516, 526. A layer of light emitting material is deposited into the pixels which will form the light emitting devices, FIG. 5d) i) shows a device with a layers of red 517, green 518 and blue 519 materials. A layer or several layers of organic photovoltaic material 527 is deposited into the pixels which will form the eventual light sensing devices FIG. 5d) ii). Suitable methods of deposition of these materials are a outlined above but ink jet printing is a most preferred method. Finally a cathode is deposited and the device is encapsulated as described above (not shown).

The use of ink-jet printing to deposit the lightemitting and photovoltaic materials of the pixels allows a great degree of variation in pixel layout to be achieved on a standard substrate. The density of photovoltaic pixels may be varied, for example with only one row of photovoltaic pixels for every nine rows of light emitting pixels, such a pixel layout allows more of the surface area of the display to be dedicated to. displaying information. To increase the sensitivity of the light detecting function of the display larger photovoltaic pixels may be used.

The light emitting pixels of the combined information display and information input device of the disclosure are arranged in the form of a matrix of independently addressable light emitting devices. Typically this matrix will comprise a series of light emitting devices addressing column electrodes and a series of light emitting devices addressing row electrodes with the light emitting devices positioned at the intersection of the row and column electrodes. Generally the column and row electrodes will have an orthogonal arrangement relative to each other. Although the row and column electrodes may be formed on the cathode and anode of the light emitting devices using a separate conductive layer, it is preferred that the anode and cathode of the light emitting device are themselves used to form the row and column electrodes respectively. In such an embodiment the anode will be formed as a continuous strip on the substrate and will serve to connect adjacent devices and the cathode will be formed as a continuous strip over the layer of light emitting material also connecting adjacent devices, with the cathode and anode in an orthogonal arrangement. Generally the row addressing electrodes will be formed from or in contact with the anode or high work function electrode and the column addressing electrodes will be formed from or in contact with the cathode or low work function electrode. The matrix of light emitting devices will typically have a resolution of 100-200 pixels per inch.

The light sensing devices may also be present as a matrix of independently addressable photodetector pixels. Alternative embodiments may be envisaged where, for example, photodetector pixels are distributed unevenly across the surface of the display, having a greater concentration in regions of the display which are commonly used to display information for a greater proportion of the time, such as the central portion of the display area. The matrix of photodetector pixels will be similar to the matrix of light emitting devices whereby the matrix is formed from an orthogonal arrangement of row and column electrodes with the photodetector pixels situated at the intersections of the row and column electrodes, preferably the row and column electrodes will be formed from the electrodes of the photodetector itself. The matrix of photodetectors will typically have a lower resolution than the matrix of light emitting pixels.

The matrices of light emitting and photodetector pixels may be addressed either passively or actively. In a passive matrix the light emitting pixels are arranged in a simple grid of rows and columns with charge being driven along a particular column or row and another row or column being grounded, the pixel at the intersection of the selected row and column emits light. Photodetector pixels may be addressed in a similar manner with charge being detected on a particular row or column rather than being driven along it. Generally charge will be driven or detected on a column whilst the rows will be sequentially grounded to scan the display. In an active matrix a switch generally a transistor, and a storage means; generally a capacitor, are located at each pixel. As in passive matrix addressing individual light emitting pixels are addressed by means of row and column electrodes with a particular row being switched on and a charge being sent down a column. This charge is stored on a storage means located at the pixel and discharges through the light emitting device causing emission of light. In the case of photodetector pixels the pixels are addressed in the same manner using the appropriate row and column but rather than driving charge onto the pixel the charge at the pixel generated by incident light is read out by appropriate circuitry, which is generally situated on the column electrode.

A photodetector pixel may also comprise a capacitor, or other charge storage means, for the storage of the charge built up at the pixel during a given addressing period. Such an arrangement allows integration of the signal and increases sensitivity.

The electronic driving of such a matrix of light emitting and light sensing devices is now described with particular reference to the driving of passive matrix arrays, clearly similar arrangements could be applied to the driving of active matrix arrays. The arrangement comprises a column driver for providing current to the light emitting devices to cause them to emit light, a column detector for detecting the current or voltage generated at the photodetector due to incident light and a row selector for scanning the now electrodes of the light emitting devices and the photodetectors. There is further a central processor unit for providing video or other image data to the column driver, for receiving the input from the column detector and for providing the timing signal to the row electrodes. Various arrangements of the column driver, column detector and the row selector are possible.

Figure 6A:
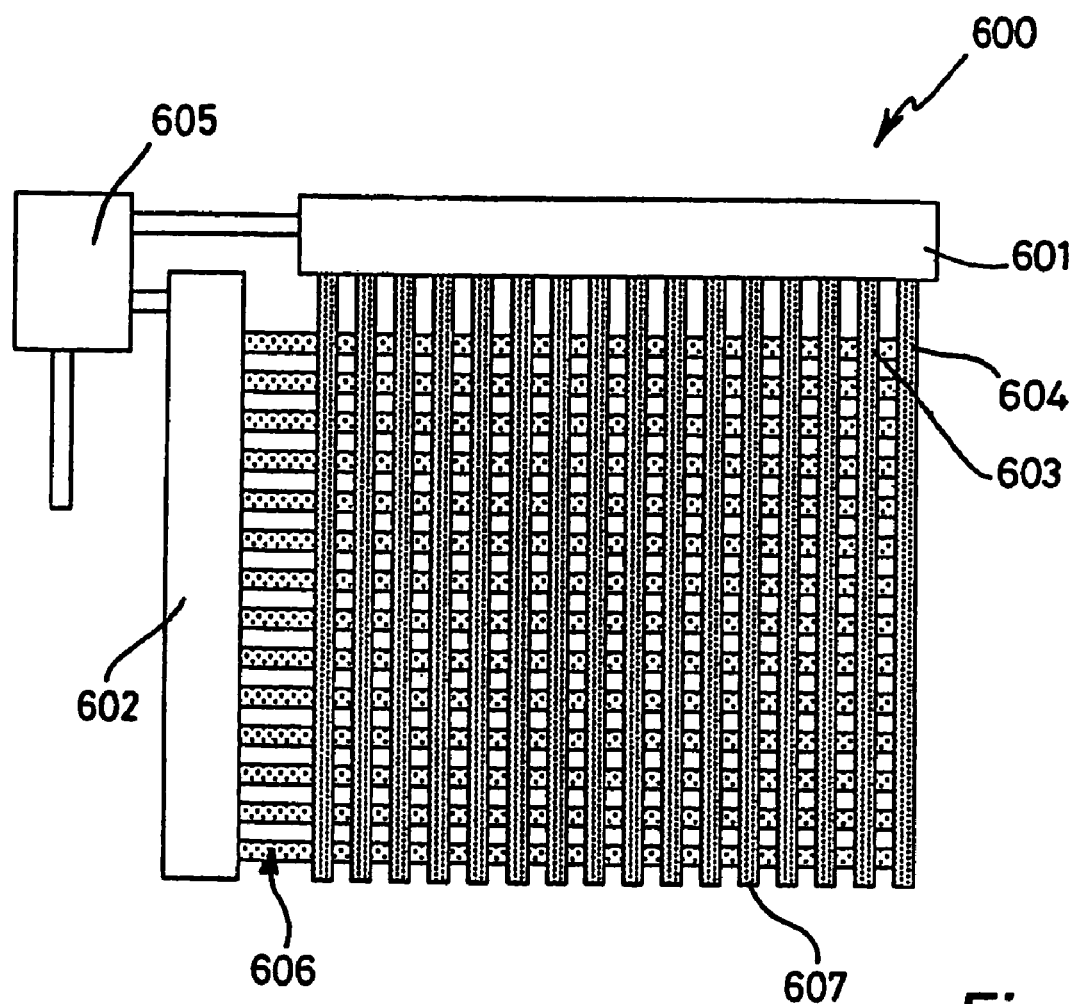
FIG. 6a) shows an implementation of a combined information display and information input device using a single column driver/detector and a single row selector to address the light emitting and light sensing pixels.

FIG. 6a) shows an implementation of a combined information display and information input device 600 using a single column driver/detector 601 and a single row selector 602 to address the light emitting 603 and light sensing pixels 604. Processor 605 provides a scanning signal to the row electrodes 606 whereby each row electrode is addressed in sequence. In order to provide a video signal the rows are scanned at a frequency of around 50 Hz. Processor 605 inputs a video, text or other signal to the column driver 601 which in turn provides a corresponding electrical signal to the appropriate column electrodes 607 of the light emitting pixels. Column detector 601 comprises circuitry for detecting the electrical signal at the photodetectors generated due to incident light. This signal forms the information input provided to the processor 605. The column driver circuitry provides a forward bias voltage to the light emitting pixels causing them to emit light. The column detector circuitry, in addition to containing circuitry for detecting the charge generated at a particular pixel may also comprise circuitry for reverse biasing the photodetector pixels to increase their sensitivity to light.

Figure 6B:
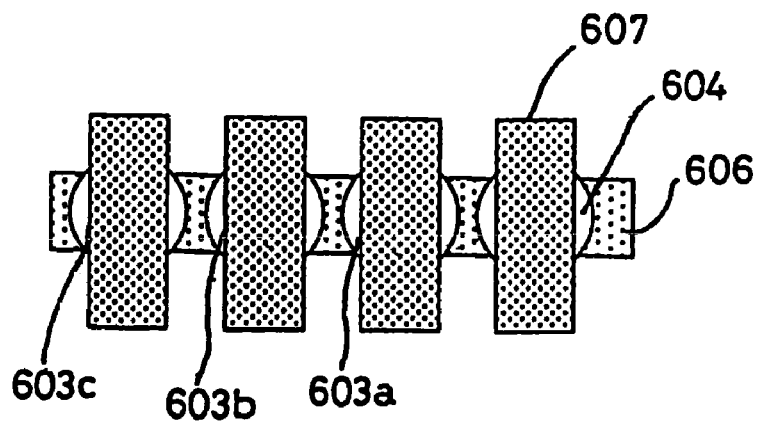
FIG. 6b) shows a typical pixel layout for the implementation of FIG. 6a).

FIG. 6b) shows a typical pixel layout for the implementation of the driving scheme of FIG. 6a). In this case the display is an RGB or full colour display having red 603a, green 603b and blue 603c pixels with a photodetector pixel 604. The light emitting pixels and the photodetector pixels are addressed by separate column electrodes 607 and by the same row electrode 606.

FIG. 6a) shows a single column driver/detector being used to address both the column electrodes of the light emitting devices and the column electrodes of the photodetectors. However, rather than provide a single driver to perform the two functions of inputting information to be displayed to the light emitting pixels and reading out the information input at the photodetector pixels it would also be possible to provide a separate driver for providing the display signal input to the light emitting pixels and a separate detector to read out the information from the photodetector pixels. Such an arrangement is shown in FIG. 7a). FIG. 7a) shows a combined information display and information input device 700 comprising a driver 701 addressing the column electrodes 709 of the light emitting pixels 705, a detector 702 addressing the column electrodes 708 of the photodetector pixels 704. A row selector 703 addresses the rows of light emitting pixels and photodetector pixels 707. A processor 706 provides a clock signal to the row selector 703, provides video, text or other signal to the column driver 701 and reads out information from the detector circuitry 702. FIG. 7b) shows a typical pixel layout for such an embodiment with three light emitting pixels 705a, 705b and 705c a photodetector pixel 704, column electrodes addressing the light emitting pixels 709 and column electrodes addressing, the photodetector pixels 708. The light emitting pixels and the photodetectors are addressed by a single row electrode 707.

Figure 8A:
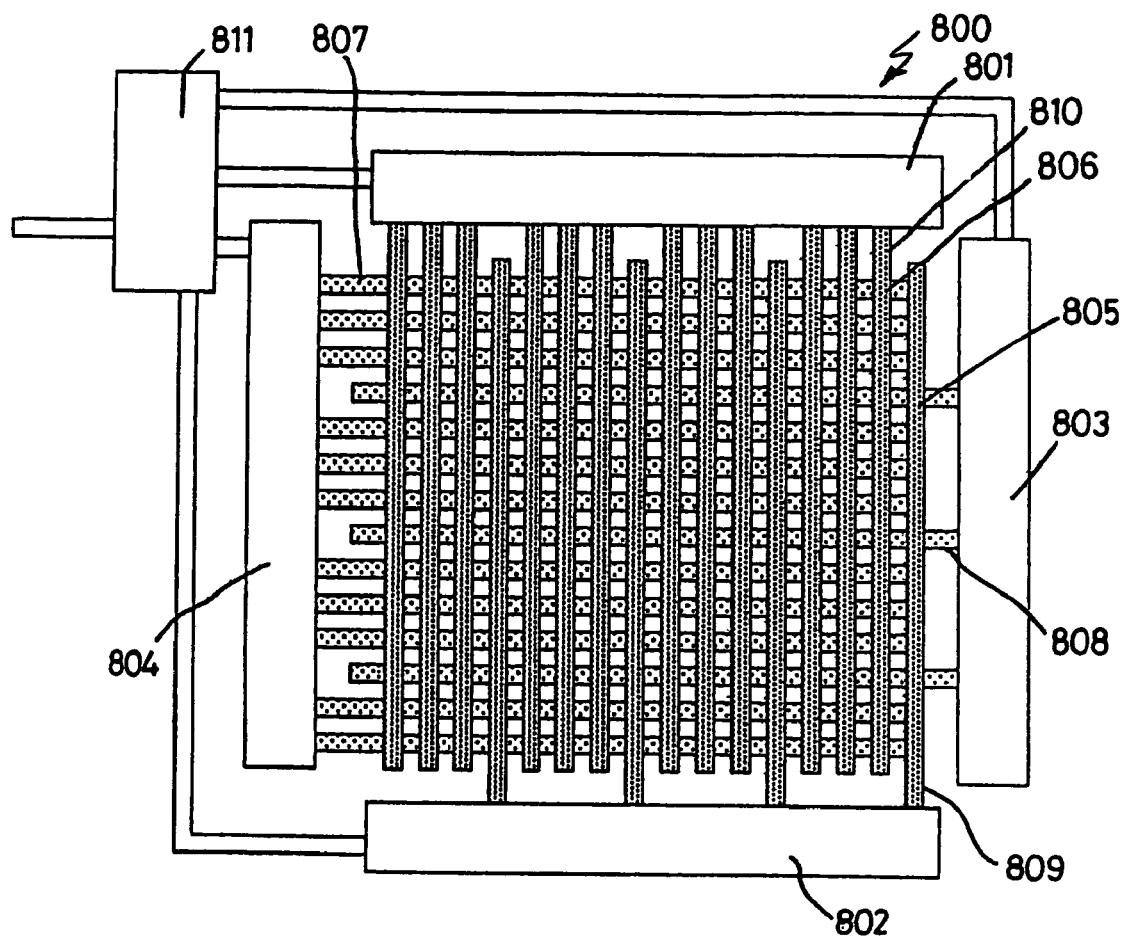
FIG. 8a) shows an implementation of a combined information display and information input device using a column driver, a column detector and a pair of row selectors to address the light emitting and light sensing pixels.

To cause sufficient light emission from the light emitting pixels requires a relatively large current, typically 1 mA. Such a large current causes considerable leakage onto neighbouring light emitting pixels and photodetector pixels. Since the current generated by incident light at a photodetector pixel is relatively small in some cases it may prove difficult to distinguish the current generated at a photodetector pixel due to incident light from the leakage current from neighbouring light emitting pixels. The drive scheme of FIG. 8a) in which the light emitting pixels and the photodetector pixels are addressed by separate row electrodes overcomes the problem of leakage current. FIG. 8a) shows a combined information display and information input device 800 comprising a driver 801 addressing the column electrodes 810 of the light emitting pixels 806, a detector 802 addressing the column electrodes 809 of the photodetectors 805. A light emitting pixel row selector 804 addressing the row electrodes 807 of the light emitting pixels 806 and a photodetector row selector 803 addressing the row electrodes 808 of the photodetector pixels 805. A processor 811 provides a scanning signal to the light emitting pixel row selector 804, a scanning signal to the photodetector row selector 803, a video, text or other signal to the column driver 801 and reads out information from the detector circuitry 802.

Figure 8B:
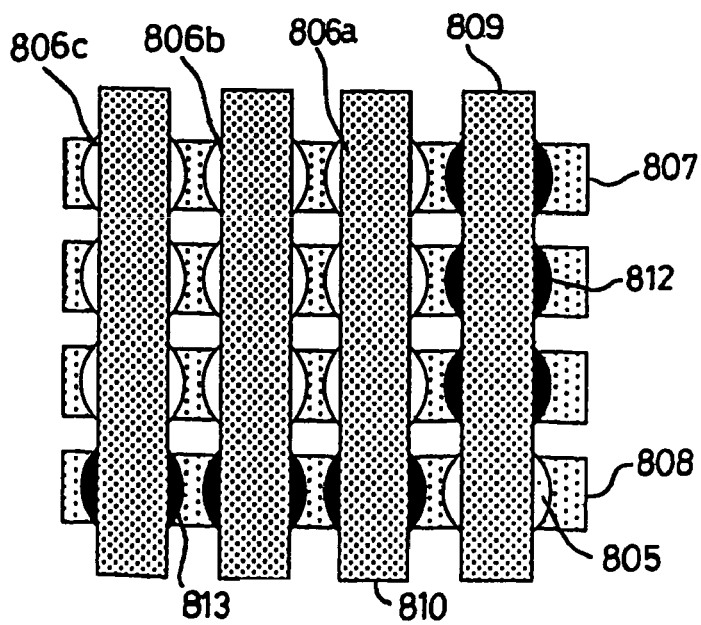
FIG. 8b) shows a typical pixel layout for the implementation of FIG. 8a).

FIG. 8b) illustrates a typical pixel configuration for the driving embodiment of FIG. 8a). A series of RGB light emitting pixels 806a, 806b and 806c are addressed by light emitting device column electrodes 810 and light emitting device row electrodes 807. Photodetector pixels 805 are addressed by a series of photodetector addressing column electrodes 809 and a series of photodetector row electrodes 808. Positions 812 along the light emitting device row electrodes which correspond to photodetectors on the photodetector row electrodes are filled with insulating material to prevent contact between the row and column electrodes at these sites. Likewise positions along the photodetector row electrodes which correspond to light emitting pixels on the light emitting device row electrodes are filled with insulating material 813. Such pixel layout schemes prevent cross talk or leakage between the light emitting pixels and the photodetectors and therefore increases the sensitivity of the light input function of the combined information display and information input device. A method for preparing such a pixel layout is described above, see FIG. 5. As mentioned above the decrease in the resolution of the photodetector pixels when using such a pixel arrangement is not necessarily disadvantageous since the resolution of the photodetector pixels is not required to be as high as the resolution of the light emitting pixels.

The processor of the above described embodiments carries out a number of functions including providing display information to the driver and reading out information from the photodetectors via the detector circuitry. The processor also provides a scanning signal to the row electrodes. This is carried out using a dock signal generating means which provides a regular signal causing the row selector to switch from addressing one of the row electrodes to another of the row electrodes. This sequence typically involves scanning neighbouring row electrodes sequentially although other sequences are possible, for example scanning every other row electrode or scanning only every fourth row electrode. The frequency of scanning is adjusted according to the information to be displayed, for example the display of video information requires the row electrodes to be scanned at a frequency of 50 Hz. The photodetector pixels do not require scanning at such a high frequency since such a rate of change in the information input to the photodetector pixels is unlikely. For this reason it is preferred that the processor either has a single clock signal generating means able to provide clock signals at least two different frequencies or that the processor has two clock signal generating means, providing clock signals at different frequencies. The higher of the two frequencies is used to scan the light emitting device row electrodes and the lower of the two frequencies is used to scan the photodetector row electrodes. In embodiments such as that of FIG. 8 where the light emitting devices and the photodetectors are situated on separate rows the different frequency scanning signals can be provided to each row selector separately. In embodiments where the light emitting devices and the photodetectors are situated on the same row, such as in FIGS. 6 and 7, the display may be scanned at a first higher frequency and information input to the driver from the processor to cause information to be displayed and the display may be scanned at a lower frequency with information being read out from the detector. For example the light emitting pixels may be driven at a frequency of 50 Hz and the photodetectors may be read at a frequency of 2 Hz, therefore on every $25^{th}$ cycle of the row selector information will be read out of the detector circuitry with the light emitting devices being driven for the other 24 cycles. A further advantage of this driving scheme is that the current generated on the photodetector may be stored on a capacitor or other storage means until the photodetector is addressed, allowing a signal of greater magnitude to be generated at each photodetector and so requiring less sensitive current detecting circuitry in the detector.

The above described information display and information input device may serve a number of functions. For example, as a touch screen where a user may respond to information displayed on the device by pointing at the device with a finger, stylus or other means with the information input function of the device then reading the information input by the user. The user may input information by for example pointing to an icon on the screen or writing on the screen. Such a touch screen could be used in a tablet PC, PDA, mobile phone, ATM, games console etc. The information display and information input device of the disclosure is particularly suited to applications in mobile computing since in the same surface area the device provides both a relatively large area display and a relatively large area input device with suitable software allowing the user to switch between the two functions or combinations of the two functions as appropriate.

The information display and information input device may also be used as a scanner. In this mode the device operates in a manner similar to a conventional scanner. A document is placed on the device, the light emitting devices provide a light source which is reflected from the document and the photodetectors convert the intensity of the reflected light into a signal which is read out by the processor via the detector circuitry. Filters may be used to allow the photodetectors to distinguish light of different colours or the organic material of the photodetector may be selected such that it is more sensitive to light of a particular wavelength with photodetectors sensitive to each of red, green and blue being provided in the scanner. Alternatively a photodetector pixel able to detect over a broad range of wavelengths may be used with the red, green and blue light emitting pixels used to generate colour information about the image being scanned.

EXAMPLE

The following example describes the preparation of a combined light emitting and light sensing device wherein the light emitting pixels and photodetector pixels are situated on different row electrodes.

A glass substrate coated with ITO patterned to form parallel lines of thickness 270 microns with gaps of 30 microns between the lines is provided. A layer of polyimide (Brewer Polyin T15010) is then spin coated onto the substrate. The polyimide is patterned to form a matrix of wells having a diameter of 75 microns. Following formation of the wells the substrate is coated with a further layer of polyimide. The second layer of polyimide is patterned to form parallel banks having a height of 10 microns and a width of 40 microns, leaving a channel of exposed ITO between the banks and wells having a width of 260 microns. The substrate comprises an array of 160 by 120 pixels.

The ITO and photoresist coated substrate is then exposed to an $O_2/CF_4$ plasma treatment. The plasma treatment is carried out in a RF barrel etcher of dimensions 300 mm diameter, 450 mm depth, with a gas mixture of 0.52% $CF_4$ in oxygen, at a pressure of 1.5 Torr and a power of 400 W.

A layer of PEDOT:PSS comprising a 0.5% aqueous solution (available from Bayer as Baytron P) is then ink-jet printed onto the wells of the substrate forming a layer of thickness 50 nm over the exposed regions of ITO (suitable inkjet printers are available from Litrex, USA). The PEDOT:PSS formulation is printed into alternate wells along each column of light emitting pixels and into alternate wells along each column of photodetector pixels. An insulator is then deposited into the empty wells i.e. Into the wells which do not contain PEDOT:PSS. The insulator comprises polystyrene which is ink-jet printed from a 0.5% toluene solution.

To form the light emitting pixels a layer of a polyfluorene, a copolymer of F8, TFB and BT which emits green light, is inkjet printed onto the PEDOT:PSS layer from a 1.5% solution in xylene:trimethylbenzene solvent, forming a layer of polyfluorene of thickness 100 nm over the PEDOT:PSS. The light emitting polyfuorene is deposited sequentially into pixels containing a layer of PEDOT:PSS in alternate rows of the device.

Photodetector pixels are prepared by ink-jet printing a blend of poly(3-hexylthiophene) and poly(2,7-(9,9-di-n-octylfluorene)-(4,7-di-2-thienyl-(benzothiazole)) in a 1% solution in xylene over the layer of PEDOT:PSS to form a layer of photovoltaic material of 100 nm thickness. Photodetector pixels are formed by printing into wells which contain a layer of PEDOT:PSS on alternate rows of the device. Photodetector pixels are formed on alternate pixels along the row such that no column contains both a photodetector pixel and a light emitting pixel.

A cathode comprising a layer of calcium of thickness 50 nm and a layer of aluminum of thickness 250 nm is then deposited upon the pixels by means of vacuum deposition. Devices are encapsulated using a metal can and UV curable adhesive.

No doubt the teaching herein makes many other embodiments of, and effective alternatives to, the disclosure apparent to a person skilled in the art. The present invention is not limited to the specific embodiments described herein but encompasses modifications which would be apparent to those skilled in the art and lying with the spirit and scope of the attached claims.

The invention claimed is:

1. A combined information display and information input device comprising a matrix of independently addressable light emitting devices and a plurality of light sensing devices, said light emitting devices comprising organic light emitting diodes comprising organic light emitting material positioned between a low work function electrode formed from a low work function material layer and a high work function electrode formed from a high work function material layer, and said light sensing devices comprising organic photovoltaic devices comprising at least an organic electron donor and at least an organic electron acceptor positioned between a high work function electrode formed from a high work function material layer and a low work function electrode formed from a low work function material layer, wherein the light emitting devices and the light sensing devices are disposed on a common substrate, and the high work function electrode of both the light emitting devices and the light sensing devices is formed from the same high work function layer and/or the low work function electrode of both the light emitting devices and the light sensing devices is formed from the same low work function layer.

2. The device of claim 1 wherein at least one of said organic electron donor and said organic electron acceptor comprises a semiconductive organic polymer.

3. The device of claim 1 wherein at least one of said organic electron donor and said organic electron acceptor comprises a fullerene.

4. The device of claim 1 wherein said organic electron donor and said organic electron acceptor comprise semiconductive organic polymers.

5. The device of claim 1 wherein said organic electron donor and said organic electron acceptor comprise a blend of semiconductive organic electron donor polymer and semiconductive organic electron acceptor polymer.

6. The device of claim 1 wherein at least one of said organic photovoltaic devices is sensitive to light in a non-visible region of the electromagnetic spectrum.

7. The device of claim 1 wherein more than one of said organic photovoltaic devices are sensitive to light in a non-visible region of the electromagnetic spectrum.

8. The device of claim 1 wherein all of said organic photovoltaic devices are sensitive to light in a non-visible region of the electromagnetic spectrum.

9. The device of claim 1 wherein at least one of said organic photovoltaic devices is sensitive to light in the infrared region of the electromagnetic spectrum.

10. The device of claim 1 wherein more than one of said organic photovoltaic devices are sensitive to light in the infrared region of the electromagnetic spectrum.

11. The device of claim 1 wherein all of said photovoltaic devices are sensitive to light in the infrared region of the electromagnetic spectrum.

12. The device of claim 1 wherein said organic light emitting devices comprise a group of light emitting devices emitting light of a color in the visible range of the electromagnetic spectrum and a further group of light emitting devices emitting light in a non-visible region of the electromagnetic spectrum.

13. The device of claim 12 wherein said further group of light emitting devices emit light in the infrared region of the electromagnetic spectrum.

14. The device of claim 1 wherein said matrix of independently addressable light emitting devices comprises a plurality of light emitting device addressing column electrodes and a plurality of light emitting device addressing row electrodes, said column electrodes intersecting said row electrodes, and said organic light emitting devices being positioned at the intersection of said column electrodes and said row electrodes.

15. The device of claim 14 wherein said plurality of light sensing devices comprises a matrix of independently addressable light sensing devices.

16. The device of claim 15 wherein said matrix of independently addressable light sensing devices comprises a plurality of light sensing device addressing column electrodes and a plurality of light sensing device addressing row electrodes, said column electrodes intersecting said row electrodes, and said light sensing devices being positioned at the intersection of said column electrodes and said row electrodes.

17. The device of claim 16 further comprising a combined column driver and detector for addressing said light emitting device column electrodes and said light sensing device column electrodes, said column driver and detector comprising circuitry for providing a forward bias to said light emitting devices to cause them to emit light and comprising circuitry for detecting light incident on said light sensing devices.

18. The device of claim 16 comprising
a) a column driver for addressing said light emitting device column electrodes, said column driver comprising circuitry for providing a forward bias to said light emitting devices to cause them to emit light, and
b) a column detector for addressing said light sensing device column electrodes, said column detector comprising circuitry for detecting light incident on said light sensing devices.

19. The device of claim 16 further comprising a combined row selector driver for addressing said light emitting device row electrodes and said light sensing device row electrodes.

20. The device of claim 16 further comprising (a) a light emitting device row selector driver for addressing said light emitting devices row electrodes and (b) a light sensing device row selector driver for addressing said light sensing device row electrodes.

21. The device of claim 17 wherein said combined column driver and detector or said column detector further comprises means for reverse biasing said light sensing devices.

22. The device of claim 18 further comprising a clock signal generator for providing a scanning signal to the combined row selector driver or to said light emitting device row selector driver and said light sensing device row selector driver.

23. The device of claim 22 wherein said clock signal generator provides scanning signals to the combined row selector driver or to said light emitting device row selector driver and said light sensing device row selector driver at a first higher frequency and a second lower frequency said first higher frequency scanning signal addressing said light emitting device row electrodes and said second lower frequency scanning signal addressing said light sensing device row electrodes.

24. The device of claim 20 further comprising a first clock signal generator and a second clock signal generator, said first clock signal generator providing a scanning signal to said light emitting device row electrodes and said second clock signal generator providing a scanning signal to said light sensing device row electrodes.

25. The device of claim 24 wherein said first clock signal generator provides a higher frequency scanning signal than said second clock signal generator.

26. The device of claim 1 further comprising a hole transporting layer between said high work function electrode and said organic light emitting material.

27. The device of claim 26, wherein the hole transporting layer of both the light emitting devices and the light sensing devices is formed from the same layer.

28. Method of preparing the device of claim 1 comprising the steps of:
(a) providing a substrate,
(b) providing a patterned layer of high work function material,
(c) providing a patterned layer of organic light emitting material and a patterned layer of organic photovoltaic material, said organic photovoltaic material comprising at least an organic electron donor and at least an organic electron acceptor, and
(d) providing a layer of low work function material,
wherein at least one of said steps of providing a patterned layer of organic light emitting material or a patterned layer of organic photovoltaic material over said layer of conductive material of high work function comprises applying said material using a method of selective printing.

29. The method of claim 28 wherein said method of selective printing is selected from the group consisting of ink-jet printing, flexographic printing, gravure printing, and screen printing.

30. The method of claim 29 wherein said method of selective printing comprises ink-jet printing.

31. Method of preparing a combined information display and information input device according to claim 1 comprising the steps of:
(a) providing a substrate,
(b) providing a patterned layer of high work function material,
(c) providing a first layer of insulating material over said layer of high work function material said first layer of insulating material being patterned to form a series of wells,
(d) providing a second layer of insulating material, said second layer of insulating material being patterned to form a series of parallel banks over said first layer of insulating material,
(e) optionally depositing by means of ink-jet printing a layer of hole transporting material into a selection of said wells,
(f) depositing by means of ink-jet printing a layer of an organic light emitting material into a first selection of said wells,
(g) depositing by means of ink-jet printing a layer of organic photovoltaic material comprising at least an organic electron donor and at least an organic electron acceptor into a second selection of said wells, and
(h) depositing a layer of low work function material over said layer of organic light emitting material and said layer of organic photovoltaic material, wherein steps (f) and (g) may be carried out in any order.

32. Method of preparing a combined information display and information input device according to claim 1, comprising the steps of;
(a) providing a substrate,
(b) providing a patterned layer of high work function material,
(c) providing a first layer of insulating material over said layer of high work function material, said first layer of insulating material being patterned to form a series of wells,
(d) providing a second layer of insulating material, said second layer of insulating material being patterned to form a series of parallel banks over said first layer of insulating material,
(e) optionally depositing by means of ink-jet printing a layer of hole transporting material into a selection of said wells,
(f) depositing by means of ink-jet printing a third layer of insulating material in a first selection of said wells,
(g) depositing by means of ink-jet printing a layer of an organic light emitting material into a second selection of said wells,
(h) depositing by means of ink-jet printing a layer of organic photovoltaic material comprising at least an organic electron donor and at least an organic electron acceptor into a third selection of said wells, and
(i) depositing a layer of low work function material over said layer of organic light emitting material and said layer of organic photovoltaic material,
wherein steps (e), (f), (g) and (h) may be carried out in any order provided that when present the layer of hole transporting material is deposited prior to the deposition of the organic light emitting material or the organic photovoltaic material.

* * * * *

UNITED STATES PATENT AND TRADEMARK OFFICE
CERTIFICATE OF CORRECTION

PATENT NO. : 7,745,817 B2  Page 1 of 1
APPLICATION NO. : 10/519371
DATED : June 29, 2010
INVENTOR(S) : Jonathan J. Halls et al.

It is certified that error appears in the above-identified patent and that said Letters Patent is hereby corrected as shown below:

In the Specification:

At Column 1, line 11, "disclosures" should be -- disclosure --.
At Column 1, line 41, "Is" should be -- is --.
At Column 2, line 30, "independently, this" should be -- independently; this --.
At Column 2, line 40, "inventors" should be -- inventors' --.
At Column 3, line 4, "fullerene, in" should be -- fullerene; in --.
At Column 3, line 37, "material, preferably" should be -- material; preferably --.
At Column 4, line 2-3, "Preferred material" should be -- Preferred materials --.
At Column 10, line 64, "sliver" should be -- silver --.
At Column 15, line 6, "an" should be -- a --.
At Column 15, line 47, "pixel" should be -- pixels --.
At Column 17, line 35, "with a layers" should be -- with layers --.
At Column 17, lines 39-40, "are a outlined" should be -- are outlined --.
At Column 17, line 49, "to." should be -- to --.
At Column 20, lines 7-11, "A light emitting pixel row selector 804 addressing the row electrodes 807 of the light emitting pixels 806 and a photo detector row selector 803 addressing the row electrodes 808 of the photodetector pixels 805." should be -- A light emitting pixel row selector 804 addresses the row electrodes 807 of the light emitting pixels 806 and a photo detector row selector 803 addresses the row electrodes 808 of the photodetector pixels 805. --.
At Column 22, line 17, "Into" should be -- into --.
At Column 22, line 25, "polyfuorene" should be -- polyfluorene --.

Signed and Sealed this
Twenty-third Day of April, 2013

Teresa Stanek Rea
*Acting Director of the United States Patent and Trademark Office*